United States Patent
Willmeroth et al.

(10) Patent No.: US 9,349,792 B2
(45) Date of Patent: *May 24, 2016

(54) SUPER JUNCTION SEMICONDUCTOR DEVICE HAVING COLUMNAR SUPER JUNCTION REGIONS

(71) Applicant: Infineon Technologies Austria AG, Villach (AT)

(72) Inventors: Armin Willmeroth, Augsburg (DE); Franz Hirler, Isen (DE); Hans-Joachim Schulze, Taufkirchen (DE); Uwe Wahl, Munich (DE); Winfried Kaindl, Unterhaching (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 14/608,258

(22) Filed: Jan. 29, 2015

(65) Prior Publication Data

US 2015/0145038 A1  May 28, 2015

Related U.S. Application Data

(62) Division of application No. 13/769,619, filed on Feb. 18, 2013, now Pat. No. 8,975,136.

(51) Int. Cl.

| | |
|---|---|
| *H01L 29/06* | (2006.01) |
| *H01L 29/66* | (2006.01) |
| *H01L 29/78* | (2006.01) |
| *H01L 21/322* | (2006.01) |
| *H01L 29/739* | (2006.01) |
| *H01L 29/32* | (2006.01) |

(Continued)

(52) U.S. Cl.

CPC ........ *H01L 29/0634* (2013.01); *H01L 21/3223* (2013.01); *H01L 29/66333* (2013.01); *H01L 29/66712* (2013.01); *H01L 29/7395* (2013.01); *H01L 29/7802* (2013.01); *H01L 29/7811* (2013.01); *H01L 21/304* (2013.01); *H01L 21/30604* (2013.01); *H01L 29/0653* (2013.01); *H01L 29/0834* (2013.01); *H01L 29/0878* (2013.01); *H01L 29/1095* (2013.01); *H01L 29/165* (2013.01); *H01L 29/32* (2013.01)

(58) Field of Classification Search
None
See application file for complete search history.

(56) References Cited

U.S. PATENT DOCUMENTS

| 2,009,011 A | 7/1935 | Gribbon | |
|---|---|---|---|
| 6,307,232 B1 * | 10/2001 | Akiyama et al. | 257/347 |

(Continued)

FOREIGN PATENT DOCUMENTS

DE    19950579 A1    5/2001

*Primary Examiner* — Bilkis Jahan

(74) *Attorney, Agent, or Firm* — Murphy, Bilak & Homiller, PLLC

(57) ABSTRACT

A super junction semiconductor device includes a semiconductor portion with a first surface and a second surface parallel to the first surface. The semiconductor portion includes a doped layer of a first conductivity type formed at least in a cell area. The super junction semiconductor device further includes columnar first super junction regions of a second, opposite conductivity type extending in a direction perpendicular to the first surface and separated by columnar second super junction regions of the first conductivity type. The first and second super junction regions form a super junction structure between the first surface and the doped layer. A distance between the first super junction regions and the second surface does not exceed 30 μm.

14 Claims, 18 Drawing Sheets

(51) Int. Cl.
 *H01L 29/08* (2006.01)
 *H01L 29/10* (2006.01)
 *H01L 29/165* (2006.01)
 *H01L 21/304* (2006.01)
 *H01L 21/306* (2006.01)

(56) References Cited

U.S. PATENT DOCUMENTS

| | | |
|---|---|---|
| 6,351,024 B1 | 2/2002 | Ruff et al. |
| 8,008,712 B2 | 8/2011 | Hille et al. |
| 8,330,233 B2 | 12/2012 | Omori |
| 9,029,944 B2 * | 5/2015 | Willmeroth ......... H01L 29/0634 257/339 |
| 2001/0005024 A1 | 6/2001 | Bauer et al. |
| 2001/0005036 A1 | 6/2001 | Porst et al. |
| 2004/0084724 A1 | 5/2004 | Kapels et al. |
| 2005/0006699 A1 | 1/2005 | Sato et al. |
| 2005/0035371 A1 * | 2/2005 | Fujihira ..................... 257/200 |
| 2005/0035405 A1 | 2/2005 | Mauder et al. |
| 2005/0156235 A1 | 7/2005 | Fujihira |
| 2006/0211179 A1 | 9/2006 | Siemieniec et al. |
| 2007/0108512 A1 | 5/2007 | Sedlmaier et al. |
| 2009/0317959 A1 | 12/2009 | Takei |
| 2011/0275202 A1 | 11/2011 | Mauder et al. |
| 2011/0300707 A1 | 12/2011 | Hille et al. |

\* cited by examiner

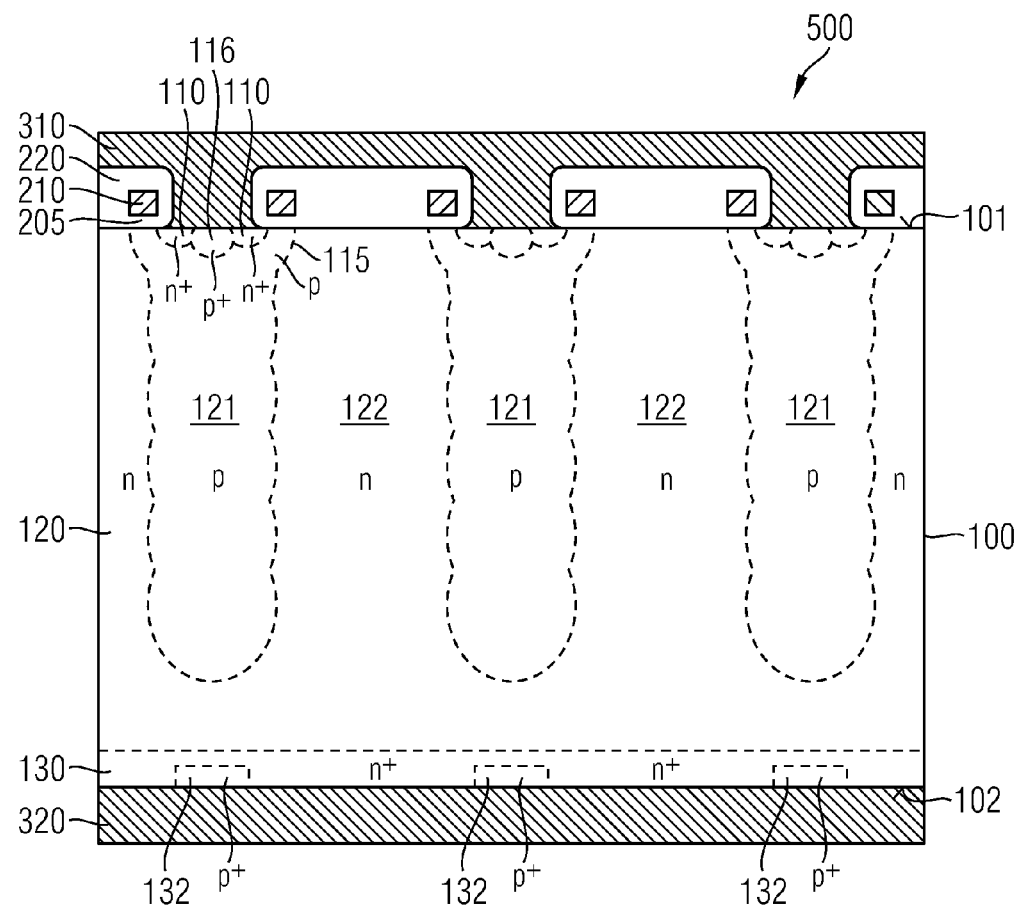

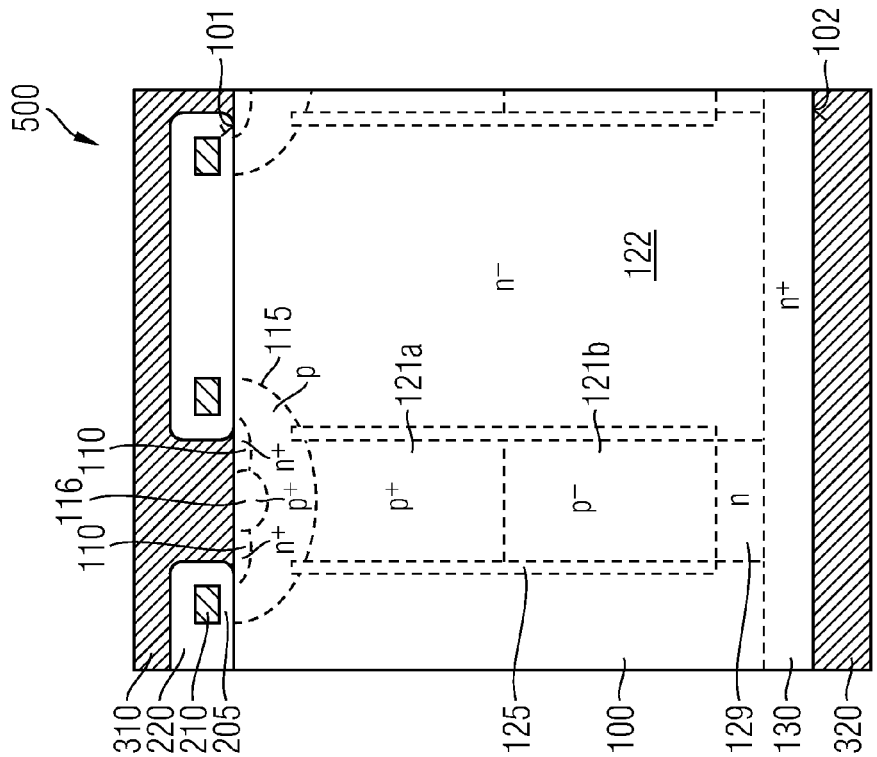
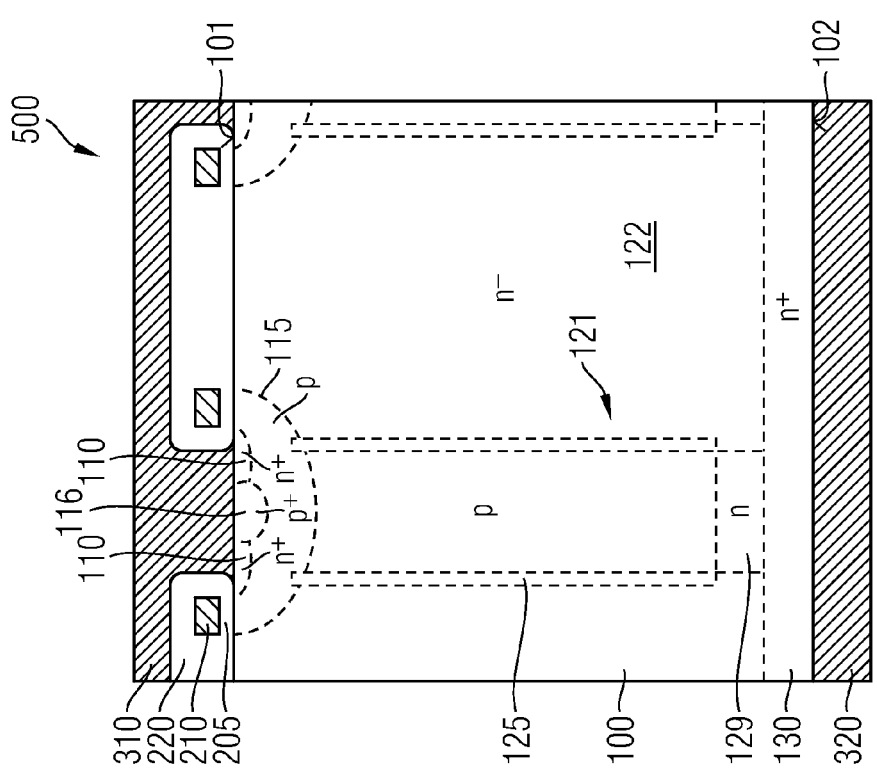

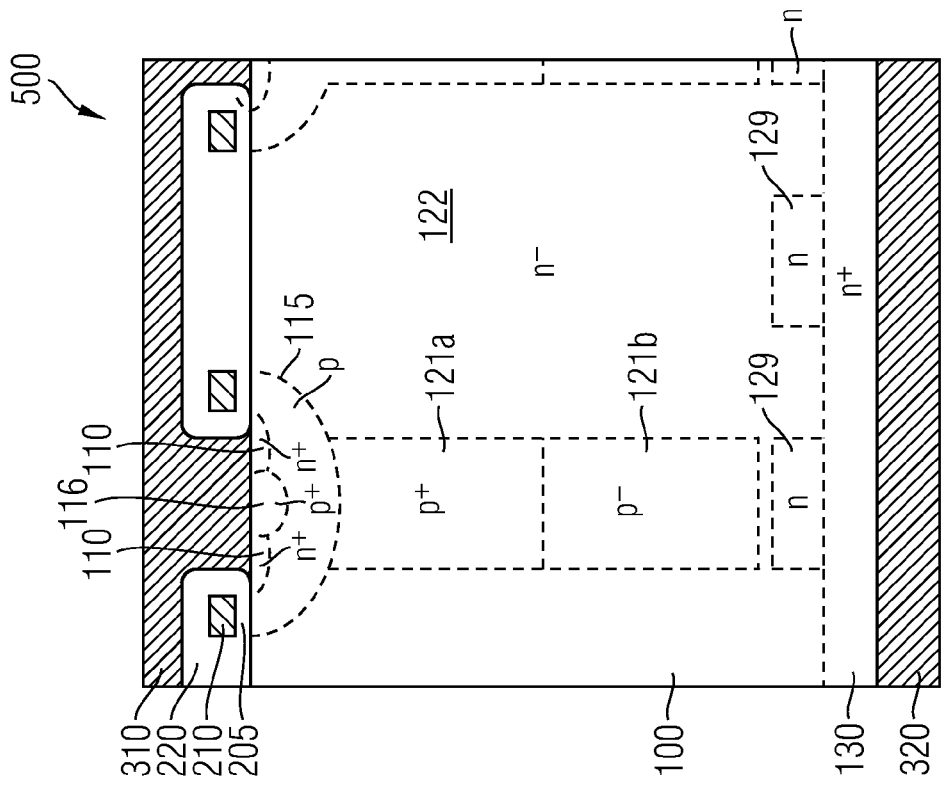
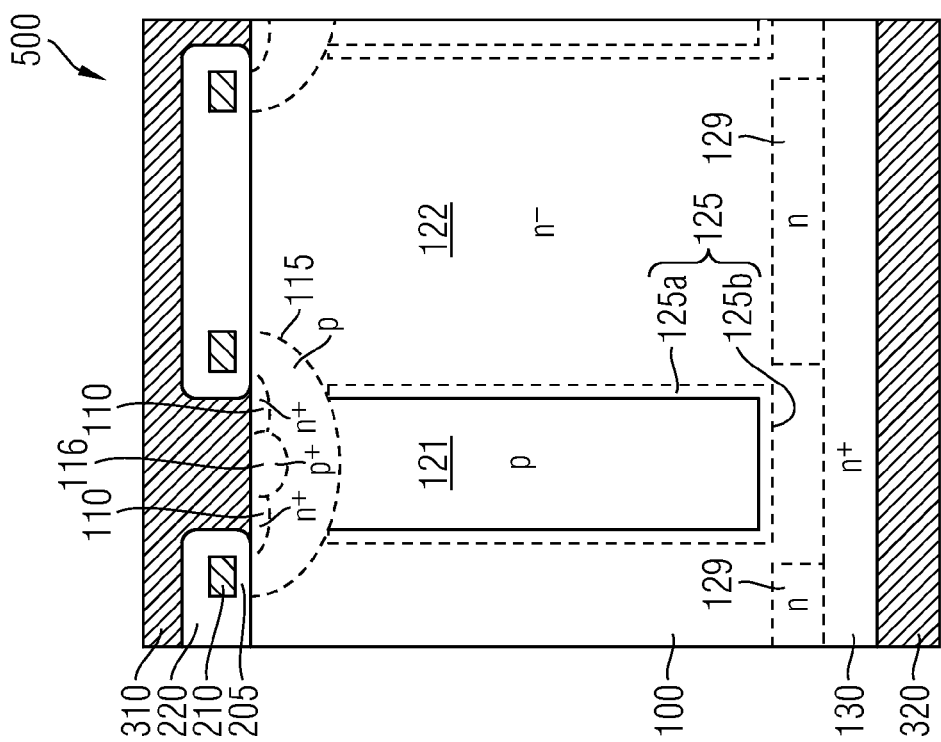

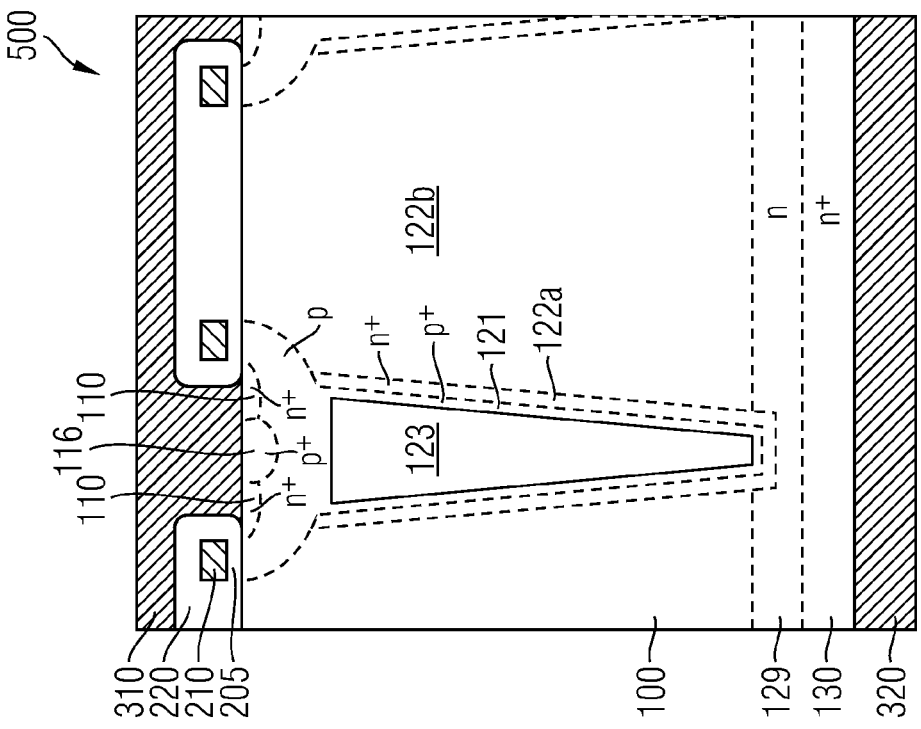
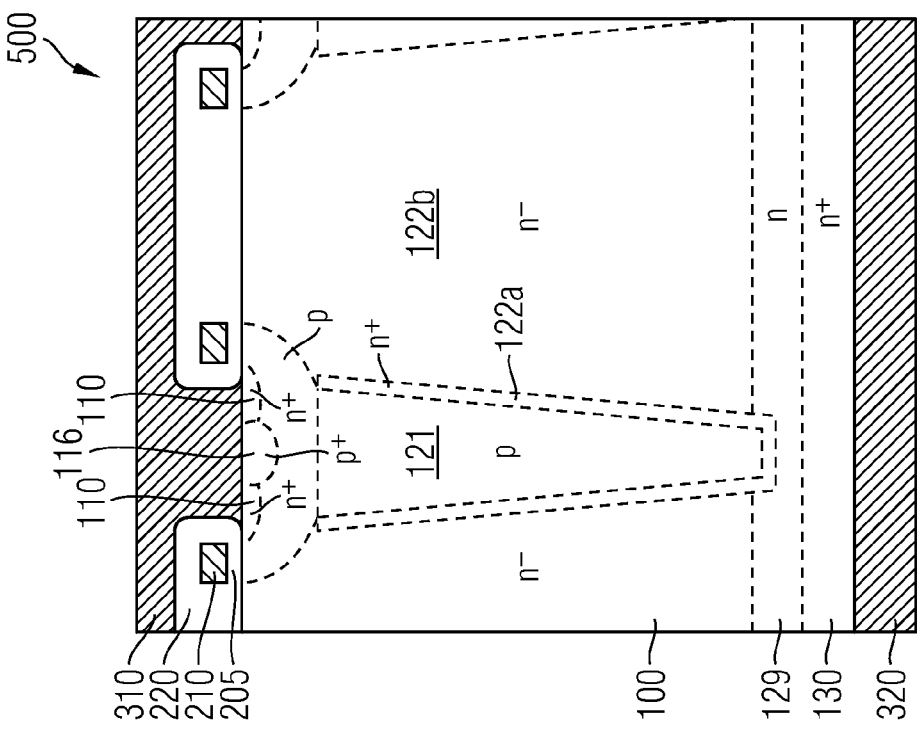

_US 9,349,792 B2_

SUPER JUNCTION SEMICONDUCTOR DEVICE HAVING COLUMNAR SUPER JUNCTION REGIONS

PRIORITY CLAIM

This application is a Divisional of U.S. patent application Ser. No. 13/769,619, filed 18 Feb. 2013, the content of said application incorporated herein by reference in its entirety.

BACKGROUND

The drift layer of a super junction semiconductor device includes p-doped columns separated by n-doped columns. A high impurity concentration in the n-doped columns assures a low on-state or forward resistance of the semiconductor device. In the reverse mode, depletion zones extend between the p-doped and n-doped columns in a lateral direction, such that a high reverse breakdown voltage can be achieved despite the high impurity concentration in the n-doped columns. Super junction semiconductor devices are typically designed for high voltage applications, with the resistance in the drift layer dominating the on-state or forward resistance. It is desirable to provide improved super junction semiconductor devices.

SUMMARY

According to an embodiment, a super junction semiconductor device includes a semiconductor portion with a first surface and a second surface that is parallel to the first surface. A doped layer of a first conductivity type is formed at least in a cell area. Columnar first super junction regions of a second, opposite conductivity type extend in a direction perpendicular to the first surface. Columnar second super junction regions of the first conductivity type separate the first super junction regions from each other. The first and second super junction regions form a super junction structure between the first surface and the doped layer. A distance between the first super junction regions and the second surface does not exceed 30 μm.

Another embodiment refers to a method of manufacturing a super junction semiconductor device. Columnar first and second super junction regions of opposite conductivity types are formed in a semiconductor substrate. The first and second super junction regions extend in a direction perpendicular to a process surface of the semiconductor substrate and form a super junction structure. The semiconductor substrate is thinned, starting from the process surface, to obtain a single crystalline semiconductor portion with a first surface and a second surface. The second surface is obtained from the process surface and is parallel to the first surface. A distance between the first super junction regions having the second conductivity type and the second surface does not exceed 30 μm. Impurities of the first conductivity type are introduced into the second surface, to form a doped layer between the super junction structure and the second surface at least in a cell area.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate embodiments of the present invention and together with the description serve to explain principles of the invention. Other embodiments of the invention and intended advantages will be readily appreciated as they become better understood by reference to the following detailed description.

FIG. 3 is a schematic cross-sectional view of a portion of a super junction semiconductor device in accordance with an embodiment providing counter-doped islands.

FIG. 9A is a schematic cross-sectional view of a portion of a super junction semiconductor device in accordance with an embodiment providing a super junction structure including a dielectric liner.

FIG. 9B is a schematic cross-sectional view of a portion of a super junction semiconductor device in accordance with an embodiment providing a super junction structure with a dielectric liner and super junction regions with graded impurity concentration.

FIG. 9C is a schematic cross-sectional view of a portion of a super junction semiconductor device in accordance with an embodiment providing a dielectric liner enclosing first super junction regions.

FIG. 9D is a schematic cross-sectional view of a portion of a super junction semiconductor device in accordance with an embodiment providing a super junction structure without a dielectric liner.

FIG. 9E is a schematic cross-sectional view of a portion of a super junction semiconductor device in accordance with an embodiment using a heavily n-doped layer for providing the super junction structure.

FIG. 9F is a schematic cross-sectional view of a portion of a super junction semiconductor device in accordance with an embodiment using heavily n-doped and p-doped layers for providing the super junction structure.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention include such modifications and variations. The examples are described using specific language, which should not be construed as limiting the scope of the appending claims. The drawings are not scaled and are for illustrative purposes only. For clarity, the same elements have been designated by the same references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The Figures illustrate relative doping concentrations by indicating "−" or "+" next to the doping type "n" or "p". For example "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The term "electrically connected" describes a permanent low-ohmic connection between electrically connected elements, for example a direct contact between the concerned elements or a low-ohmic connection via a metal and/or highly doped semiconductor.

Figure 1A:
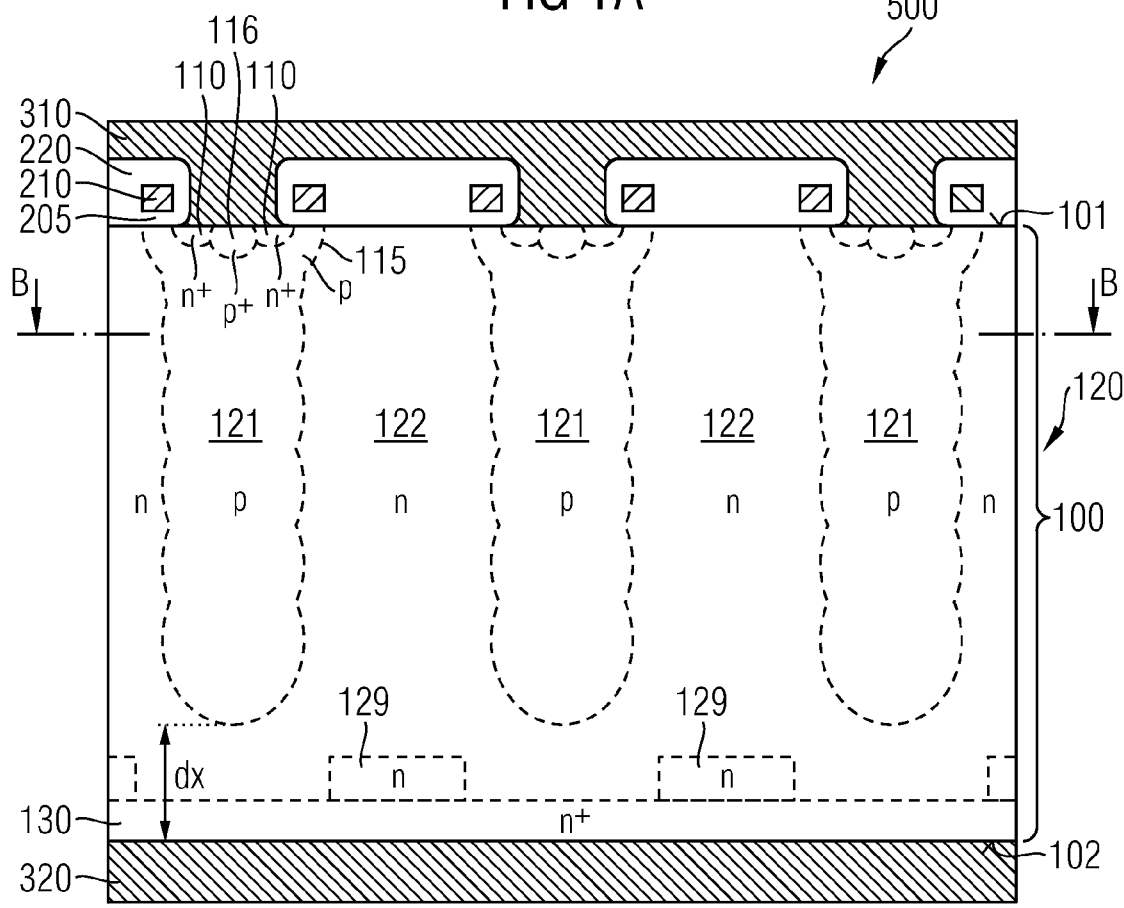
FIG. 1A is a schematic cross-sectional view of a portion of a super junction semiconductor device in accordance with an embodiment.
Figure 1B:
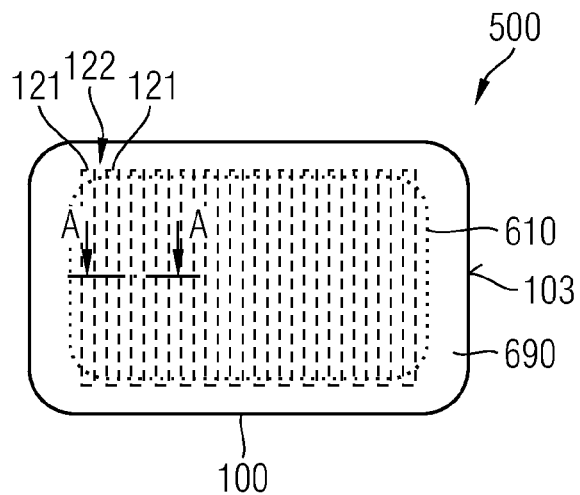
FIG. 1B is a schematic cross-sectional view of the semiconductor device of FIG. 1A along line B-B.
Figure 1C:
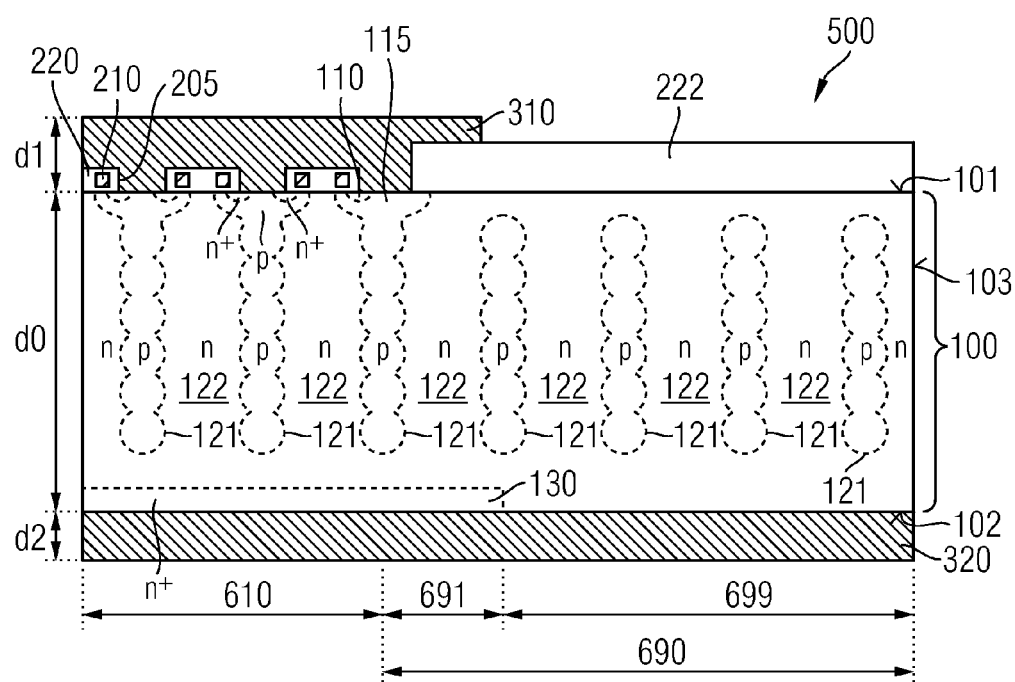
FIG. 1C is a schematic cross-sectional view of a portion of a semiconductor device having a cell area and an edge area, according to an embodiment providing a field stop structure.

FIGS. 1A and 1C show a super junction semiconductor device 500 with a semiconductor portion 100 having a first surface 101 and a second surface 102 parallel to the first surface 101. The semiconductor device 500 may be, for example, an IGFET (insulated gate field effect transistor), for example an MOSFET (metal oxide semiconductor field effect transistor) in the usual meaning including FETs with metal and with non-metal gate electrodes, an IGBT (insulated gate bipolar transistor) or a diode. The semiconductor portion 100 is provided from a single-crystalline semiconductor material, for example silicon Si, silicon carbide SiC, germanium Ge, a silicon germanium crystal SiGe, gallium nitride GaN or gallium arsenide GaAs. A distance between the first and second surfaces 101, 102 may be less than 175 µm, for example at most 100 µm or at most 60 µm. The semiconductor portion 100 may have a rectangular shape with an edge length in the range of several millimeters. The normal to the first and second surfaces 101, 102 defines a vertical direction and directions orthogonal to the normal direction are lateral directions.

The semiconductor portion 100 includes a doped layer 130 of a first conductivity type. In the case of diodes and IGFETs, the doped layer 130 directly adjoins the second surface 102 and a net impurity concentration in the doped layer 130 is comparatively high, e.g., at least $5 \times 10^{18}$ cm$^{-3}$. According to other embodiments, a further layer may be provided between the doped layer 130 and the second surface 102. For example, for IGBTs an emitter layer of a second conductivity type, which is the opposite of the first conductivity type, may be arranged between the doped layer 130 and the second surface 102, wherein a net impurity concentration in the doped layer 130 is lower than $5 \times 10^{18}$ cm$^{-3}$.

A drift layer 120 is located between the first surface 101 and the doped layer 130. The drift layer 120 includes first super junction regions 121 of the second conductivity type and second super junction regions 122 of the first conductivity type. The first super junction regions 121 may directly adjoin the doped layer 130. According to other embodiments, the first super junction regions 121 are formed at a distance to the doped layer 130 such that the drift layer 120 includes a contiguous portion of the first conductivity type that extends between the buried edges of the first and second super junction regions 121, 122 on the one side and the doped layer 130 on the other side. The first and second super junction regions 121, 122 directly adjoin to each other.

As shown in FIG. 1B, the semiconductor portion 100 may include a cell area 610 and an edge area 690 surrounding the cell area 610 in the lateral directions. The edge area 690 extends along an outer surface 103 of the semiconductor portion 100, wherein the outer surface 103 connects the first and second surfaces 101, 102. The edge area 690 may directly adjoin the cell area 610. According to other embodiments, one or more transition areas may separate the edge and the cell areas 610, 690, wherein the transition areas may include both features missing in the cell area 610 and features missing in the edge area 690. The doped layer 130 may extend along a complete cross-sectional plane of the semiconductor portion 100 parallel to the second surface 102 or may be restricted to the cell area 610.

The first and second super junction regions 121, 122 may be parallel stripes arranged at regular distances, respectively. According to other embodiments, the cross-sections of the first super junction regions 121 parallel to the first surface 101 may be circles, ellipsoids, ovals or rectangles, e.g., squares, with or without rounded corners, and the second super junction regions 122 may form a grid embedding the first super junction regions 121.

The semiconductor portion 100 further includes one or more doped zones 110 formed at least in the cell area 610. The one or more doped zones 110 have the same conductivity type and directly adjoin the first surface 101. In a conductive mode (on-state) or forward mode of the semiconductor device 500, an on-state or forward current flows between the one or more doped zones 110 and the doped layer 130 through the drift layer 120.

Embodiments concerning a super junction diode provide one single doped zone 110 of the second conductivity type that may form an anode zone directly adjoining the first and second super junction regions 121, 122 in the cell area 610. Embodiments concerning a super junction IGFET or a super junction IGBT provide a plurality of doped zones 110 of the first conductivity type, wherein each of the doped zones 110 directly adjoins to a body zone 115 of the second conductivity type and each body zone 115 directly adjoins to at least one of the first and one of the second super junction regions 121, 122. At least the doped zones 110 may be exclusively formed within the cell area 610 and may be absent in the edge area 690. The body zones 115 are provided at least in the cell area 610 and may or may not be absent in the edge area 690.

For IGFETs and IGBTs, gate electrode structures 210 may be provided to control a minority charge carrier distribution in the body zones 115 between the doped zones 110 and the corresponding second super junction regions 122. A gate dielectric 205 is formed between the respective gate electrode structure 210 and the corresponding body zone 115. The gate electrode structures 210 may be arranged above the first surface 101. According to other embodiments, the gate electrode structures 210 may be provided in trenches extending from the first surface 101 into the semiconductor portion 100.

A first electrode structure 310 may be electrically connected to the doped zones 110 and, for IGFETs and IGBTs, to the body zones 115 through openings in a dielectric layer 220 covering the gate electrode structures 210. The openings in the dielectric layer 220 are formed between neighboring gate electrode structures 210. Highly doped contact zones 116 of the second conductivity type may be formed within the body zones 115 in direct contact with the first electrode structure 310. The dielectric layer 220 electrically insulates the first electrode structure 310 and the gate electrode structures 210.

A second electrode structure 320 directly adjoins the second surface 102 of the semiconductor portion 100. The second electrode structure 320 may directly adjoin the doped layer 130. For IGBTs, the second electrode structure 320a directly adjoins an emitter layer of the second conductivity type that is formed between the doped layer 130 and the second surface 102.

Each of the first and second electrode structures 310, 320 may consist of or contain, as main constituent(s), aluminum Al, copper Cu, or alloys of aluminum or copper, for example AlSi, AlCu or AlSiCu. According to other embodiments, one or both of the first and second electrode structures 310, 320 may contain, as main constituent(s), nickel Ni, titanium Ti, silver Ag, gold Au, platinum Pt and/or palladium Pd. For example, at least one of the first and second electrode structures 310, 320 includes two or more sub-layers, each sub-layer containing one or more of Ni, Ti, Ag, Au, Pt, and Pd as main constituent(s), e.g., silicides and/or alloys therefrom. A peripheral dielectric 222 may be provided in the edge area 690 on the first surface 101.

The illustrated embodiment refers to an IGFET, wherein the first conductivity type is the n-type, the second conductivity type is the p-type, the first electrode structure 310 is a source electrode, the doped zones 110 are source zones, the doped layer 130 is a drain layer and the second electrode structure 320 is a drain electrode. According to other embodiments, the first conductivity type may be the p-type.

A distance dx between the first super junction regions 121 and the second surface 102 is at most 30 µm, for example at most 20 µm or at most 15 µm. Due to the low distance between the super junction structure and the second surface 102, the on-state or forward resistance is dominated by the resistance of the drift layer 120, which is comparatively low due to the fact that the super junction structure allows a comparatively high impurity concentration in the drift layer 120. The on-state or forward resistance of low-voltage devices rated for reverse breakdown voltages below 1000 V is defined by the resistance of the super junction structure instead of the resistance of a base substrate. Unwanted electric resistance of the semiconductor portion can be avoided for voltage classes below 1000 V.

A field stop structure 129 of the first conductivity type may be formed between the super junction structure and the doped layer 130. The field stop structure 129 may directly adjoin the doped layer 130. A mean impurity concentration of the field stop structure 129 is at most 50% of a maximum impurity concentration in the doped layer 130. For example, the mean net impurity concentration in the field stop structure 129 is between $5 \times 10^{14}$ cm$^{-3}$ and $5 \times 10^{15}$ cm$^{-3}$. The field stop structure 129 may be a contiguous layer oriented parallel to the second surface 102. Other embodiments may provide a segmented field stop structure 129, wherein the segments may be provided in the vertical projection of the first super junction regions 121 and may be absent in the vertical projection of the second super junction regions 122 or vice versa, as illustrated.

Other embodiments provide a laser fusing process to anneal the implanted field stop structures 129. For example, the implanted impurities contain selenium Se, phosphorus P atoms/ions or both in combination. The laser anneal reduces the thermal load and is applicable for thin silicon wafers including the substrate portions.

When a reverse voltage is applied, the field stop structure 129 prevents a depletion zone extending from the pn-junctions between the first and second super junction regions 121, 122 in the vertical direction towards the second surface 102 from intruding the doped layer 130 up to a depth at which the depletion zone reaches the second electrode structure 320 or unavoidable spikes of metal extending from the second electrode structure 320 into the doped layer and, as a consequence, ensures a soft switching behavior of the semiconductor device 500. The doped layer 130, the field stop structure 129 and the first and second electrode structures 310, 320 may be formed both in the cell area 610 and the edge area 690 surrounding the cell area 610, or may be formed exclusively in the cell area 610, respectively.

According to the embodiment shown in FIG. 1C the doped layer 130 and the first electrode structure 310 are absent in at least an outer edge portion 699 extending along the outer surface 103 of the semiconductor portion 100. At least one structure or component allowing an on-state or forward current to flow in the second super junction regions 122 of the cell area 610, for example a gate electrode, a source zone, a source contact, a body zone or a gate contact is either not provided in the edge area 690, or without connection, or inoperable for other reasons.

FIG. 1C shows the first electrode structure 310 with a first thickness d1 and the second electrode structure 320 with a second thickness d2. A sum of the first and second thicknesses d1, d2 is at least 20% of a thickness d0 of the semiconductor portion 100 between the first and the second surfaces 101, 102. For example, an IGFET specified for a breakdown voltage of 600V may have a semiconductor portion 100 with a thickness of about 60 µm. The total metallization thickness, which is the sum of the first and second thicknesses d1, d2 is at least 12 µm. The comparatively thick metallization provides a high heat capacity that is effectively thermally coupled to the semiconductor portion 100 at a low thermal resistance. The thick metallization prevents a rapid heating of the semiconductor device 500 and settles the poor heating capacity of the comparatively thin substrate portion 100.

FIGS. 2A to 2D illustrate a method of manufacturing a super junction semiconductor device 500. A base substrate 190 with two parallel process surfaces 191, 192 is provided, and includes a single crystalline semiconductor material. The semiconductor material may be silicon Si, silicon carbide SiC, Germanium Ge, a silicon germanium crystal SiGe, gallium nitride GaN or gallium arsenide GaAs. The base substrate 190 may be a homogenous substrate from the semiconductor material, e.g., a silicon wafer, or a multi-material substrate with the semiconductor material provided as a semiconductor layer on a non-semiconducting carrier substrate provided, for example, from a silicon oxide or glass, e.g., an SOI (silicon-on-insulator) wafer.

Figure 2A:
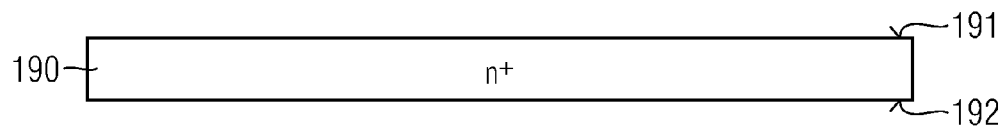
FIG. 2A is a schematic cross-sectional view of a base substrate for illustrating a method of manufacturing a super junction semiconductor device according to an embodiment that provides growing a semiconductor layer by epitaxy.

FIG. 2A shows the base substrate 190 with the two parallel process surfaces 191, 192. In the illustrated embodiment, the semiconductor material of the base substrate 190 is heavily $n^+$-doped. Other embodiments may provide an intrinsic or p-doped semiconductor material. The base substrate 190 may or may not contain implanted sections adjoining a first process surface 191. A single-crystal semiconductor layer 180 may be grown by epitaxy on the first process surface 191, wherein the grown single-crystal lattice of the semiconductor layer 180 grows in registry with the single-crystal of the base substrate 190.

First and second super junction regions 121, 122 are formed in the semiconductor layer 180 by repeating a sequence including (i) growing a sub-layer per epitaxy and (ii) implanting impurities of at least one conductivity type into a surface of the sub-layer using an implant mask, wherein the super junction structure is obtained by diffusing the implanted impurities out of the implant zones to form at least one of the first and second super junction regions 121, 122. For IGFETs and IGBTs, a plurality of body zones 115 of the second conductivity type and doped zones 110 of the first conductivity type are formed. Doped zones 110 or one single doped zone 110 of the second conductivity type and no body zones 115 are provided in the case of super junction diodes.

Figure 2B:
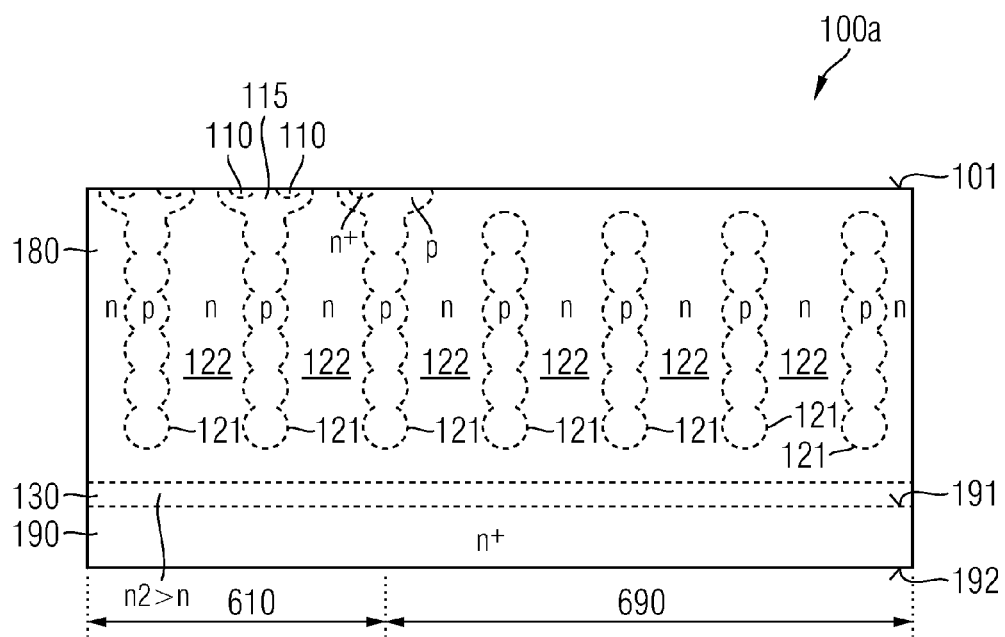
FIG. 2B is a schematic cross-sectional view of a semiconductor substrate obtained from the base substrate of FIG. 2A by epitaxy.

FIG. 2B shows a semiconductor substrate 100a including the base substrate 190 and the semiconductor layer 180 which includes a super junction structure formed by the first and second super junction regions 121, 122. Each body zone 115 directly adjoins to one of the first super junction regions 121. The doped zones 110 are formed within the body zones 115, wherein both the doped zones 110 and the body zones 115 directly adjoin a first surface 101 of the semiconductor substrate 100a. Gate dielectrics 205 may be formed on the first surface 101. Gate electrodes 210 may be provided on the gate dielectrics 205. A dielectric layer 220 may be provided to encapsulate the gate electrodes 210 and to insulate the second super junction regions 122. A first electrode structure 310 is provided directly adjoining portions of the first surface 101 between the gate electrodes 210. According to an embodiment, impurities diffusing out of the heavily $n^+$-doped base substrate 190 of FIG. 2A during the growth of the semiconductor layer 180 may form a doped layer 130 directly adjoining the second surface 102.

Both the reverse breakdown voltage and the on-state/forward current increase with increasing thickness of the semiconductor portion 100. For applications tolerating a lower reverse breakdown voltage, the semiconductor substrate 100a is thinned from the exposed second process surface 192 of the base substrate 190 to reduce the on-state or forward resistance. Thinning may include a CMP (chemical mechanical polishing), a wet etching, or a combination of both.

Figure 2C:
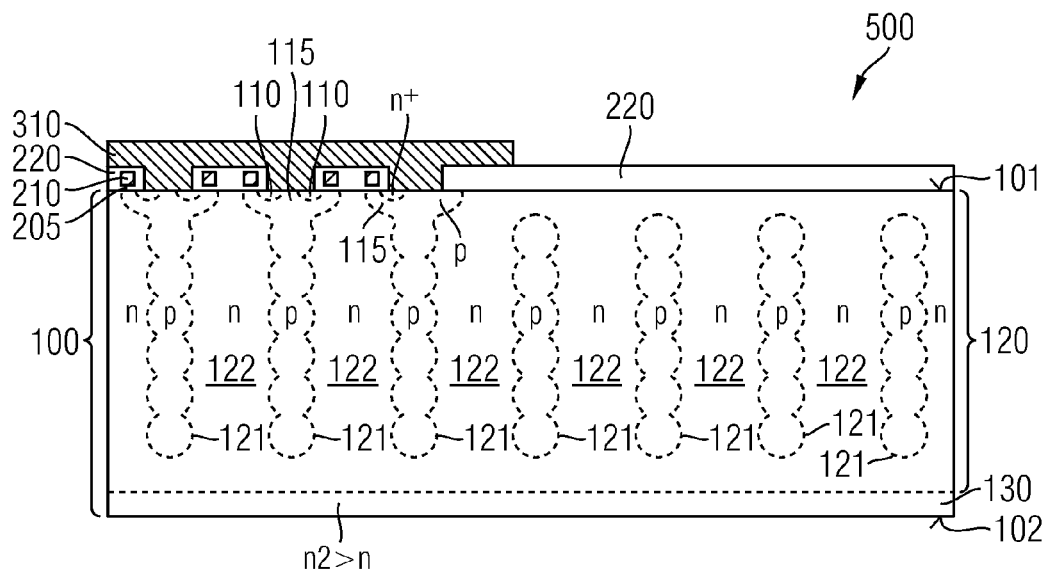
FIG. 2C is a schematic cross-sectional view of a semiconductor portion obtained from the semiconductor substrate of FIG. 2B by thinning.

FIG. 2C shows a semiconductor portion 100 resulting from the semiconductor substrate 100a of FIG. 2B by thinning from the second process surface 192. A first surface 101 of the semiconductor portion 100 corresponds to the exposed surface of the semiconductor layer 180 of FIG. 2B after the epitaxy process. The thinning exposes a second surface 102 parallel to the first surface 101. A doped layer 130 may be formed by implanting impurities into the thinned second surface 102. A second electrode structure 320 is provided that directly adjoins the second surface 102.

Figure 2D:
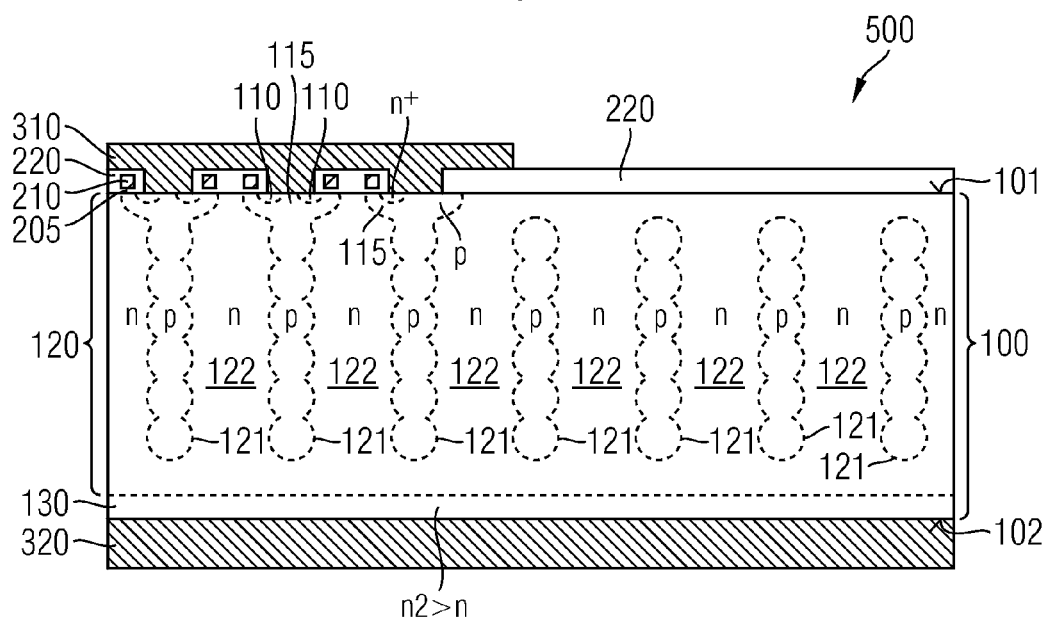
FIG. 2D is a cross-sectional view of a portion of a semiconductor device obtained from the semiconductor portion of FIG. 2C.

FIG. 2D shows the semiconductor device 500 resulting from the semiconductor portion 100 of FIG. 2C. As described above, the doped layer 130 may be introduced into the semiconductor portion 100 by out-diffusion from the base substrate 190.

According to another embodiment, the doped layer 130 is introduced by performing an ion beam implant of, for example phosphor P, arsenic As, sulfur S, selenium Se, hydrogen H (protons) and/or helium He into the second surface 102 after thinning. The implant may be performed at an implant dose which amorphizes a section of the semiconductor portion 100 directly adjoining the second surface 102. The amorphized portion may be tempered at a temperature between 300 and 500 degree Celsius such that the doped layer 130 is formed by solid phase epitaxy. The doped layer 130 may be tempered using a laser fusion process, wherein the laser is controlled to be exclusively effective in a portion of the second surface 102 where the doped layer 130 is formed.

FIG. 3 refers to an embodiment providing counter-doped islands 132 of the second conductivity type which directly adjoin the second surface 102. The counter-doped islands are separated by portions of the doped layer 130, and are electrically connected to the second electrode structure 320. The counter-doped islands 132 are formed in the cell area 610 and may be absent in edge area 690 surrounding the cell area 610.

At current densities exceeding a threshold that depends on the applied voltage between the first and second electrode structures 310 and 320, the counter-doped islands 132 inject charge carriers into the drift layer 120. Since the injected charge carriers increase the density of free charge carriers in the drift zone 120, the counter-doped islands 132 reduce the on-state or forward resistance at current densities exceeding the threshold. According to embodiments providing n-IGFETs, the counter-doped islands are p-doped.

Conventional super junction IGFETs with substrate portions having a thickness greater than 175 µm typically provide floating counter-doped islands embedded between the drift layer and the doped layer. Floating counter-doped islands begin to inject charge carriers into the drift layer only when a Zener breakthrough takes places that electrically connects the floating counter-doped islands to the doped layer. Hence, conventional, floating counter-doped islands become active only at comparatively high current densities that generate a voltage drop sufficient to trigger the Zener breakthrough to the drain layer. Since usually the floating counter-doped islands are provided at an early stage of the processing and are subjected to a high temperature budget, the pn-junction between the floating counter-doped islands and the drain layer is not abrupt, resulting in a comparatively high Zener breakthrough voltage. Hence, charge carrier injection only takes place at high voltage drops over the substrate portion.

Instead, according to the embodiments, the counter-doped islands 132 may be implanted directly through the second surface 102 after the thinning of the substrate portion 100 such that the counter-doped islands 132 are electrically connected to the second electrode structure 320.

As a result, the counter-doped islands 132 start injecting charge carriers at a voltage drop of about 0.6 V, which is significantly less than the Zener breakthrough voltage in conventional designs. The counter-doped islands 132 inject charge carriers at lower current densities and, as a result, reduce the on-state or forward resistance at yet lower current densities than conventional approaches.

The counter-doped islands 132 may be located in the vertical projection of the first super junction regions 122 and may be absent in the vertical projection of the second super junction regions 121, as illustrated, or vice versa. Portions of the doped layer 130 separate the counter-doped islands 132. The doped layer 130 may form a grid embedding the counter-doped islands 132. A maximum impurity concentration in the counter-doped islands 132 may be at least $5 \times 10^{17}$ cm$^{-3}$. At low current densities, the portions of the doped layer 130 separating the counter-doped islands 132 ensure a current path to the second electrode structure 320. The counter-doped islands 132 may be combined with a field stop structure 129 blocking a punch-through of an electric field into the counter-doped island 132 in a reverse mode of the semiconductor device 500.

FIGS. 4A to 4D refer to an embodiment providing the counter-doped islands 132 from a base substrate 190 that is heavily doped with impurities of the second conductivity type or at least contains a heavily doped layer on a carrier substrate. Through openings in an implant mask 199, impurities of the first conductivity type are implanted into first sections 130a of a first process surface 191 of the base substrate 190, wherein second sections of the first process surface 191 between the first sections 130a are covered by the implant mask 199 and remain without implant.

Figure 4A:
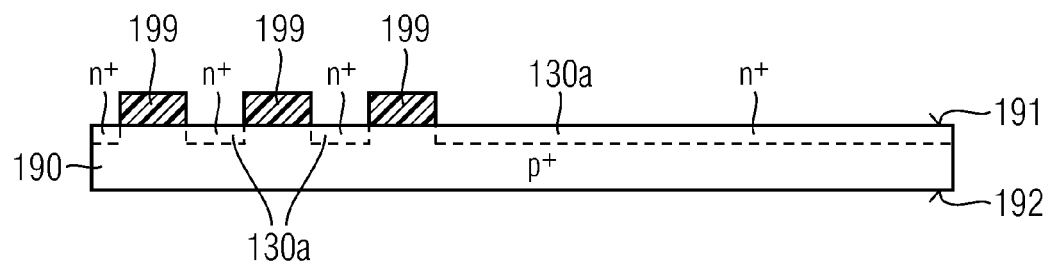
FIG. 4A is a schematic cross-sectional view of a base substrate for illustrating a method of manufacturing a super junction semiconductor device using implants into the base substrate.

FIG. 4A shows the base substrate 190, which includes implanted sections 130a below the first process surface 191. A semiconductor layer 180 is grown by epitaxy onto the first process surface 191 as described in context with FIG. 2B.

Figure 4B:
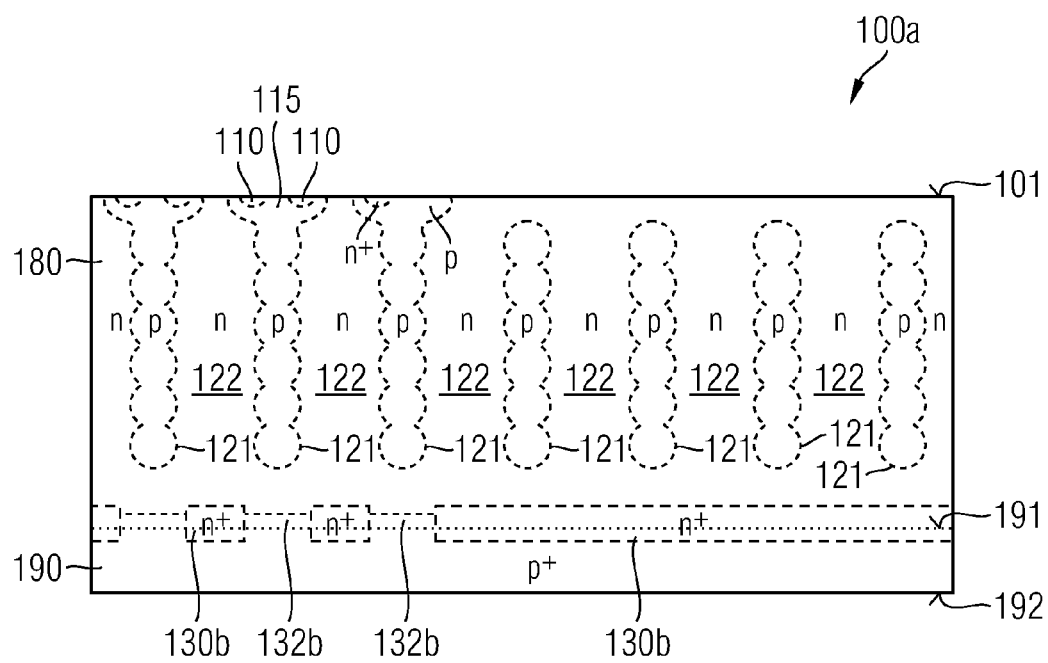
FIG. 4B is a schematic cross-sectional view of a semiconductor substrate obtained from the base substrate of FIG. 4A.

FIG. 4B shows the semiconductor layer 180 grown on the base substrate 190. A super junction structure including first and second super junction regions 121, 122 is formed in the semiconductor layer 180. Impurities of the first conductivity type diffuse out from the implanted first sections 130a into the semiconductor layer 180, forming diffused sections 130b extending over portions of both the base substrate 190 and the semiconductor layer 180. Between the diffused sections 130b of the first conductivity type, impurities of the second conductivity type diffuse out from the base substrate 190 into the semiconductor layer 180, forming counter-doped diffused sections 132b extending over portions of both the base substrate 190 and the semiconductor layer 180. The semiconductor substrate 100a, including the base substrate 190 and the semiconductor layer 180, is thinned, starting from the second process surface 192 of the base substrate 190.

Figure 4C:
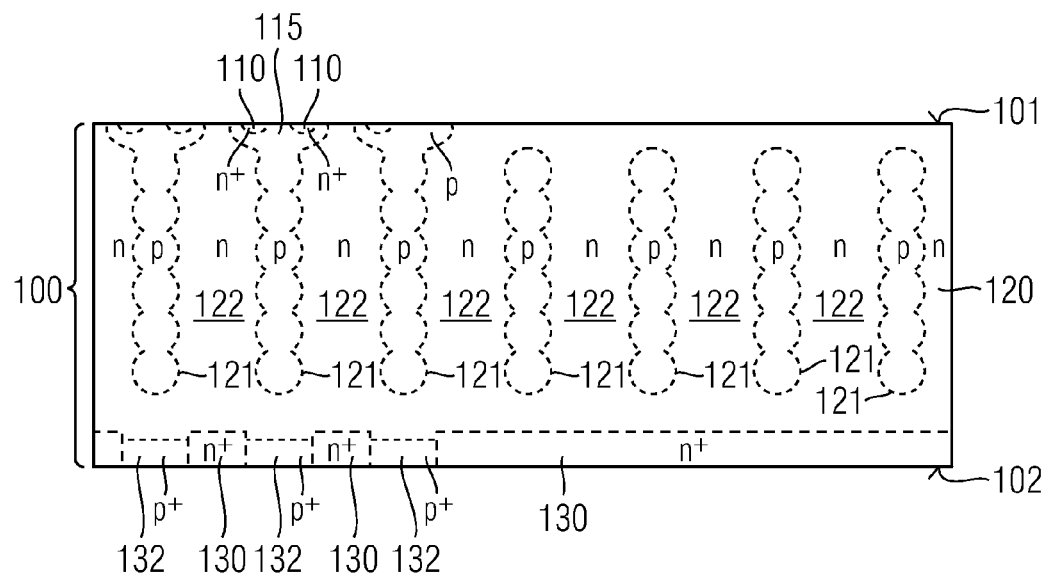
FIG. 4C is a schematic cross-sectional view of a semiconductor portion obtained from the semiconductor substrate of FIG. 4B by thinning.

FIG. 4C illustrates a semiconductor portion 100 obtained by thinning the semiconductor substrate 100a of FIG. 4B from the second process surface 192. Portions of the diffused sections 130b of the first conductivity type form a segmented doped layer 130. Portions of the counter-doped diffused sections 132b form counter-doped islands 132.

Figure 4D:
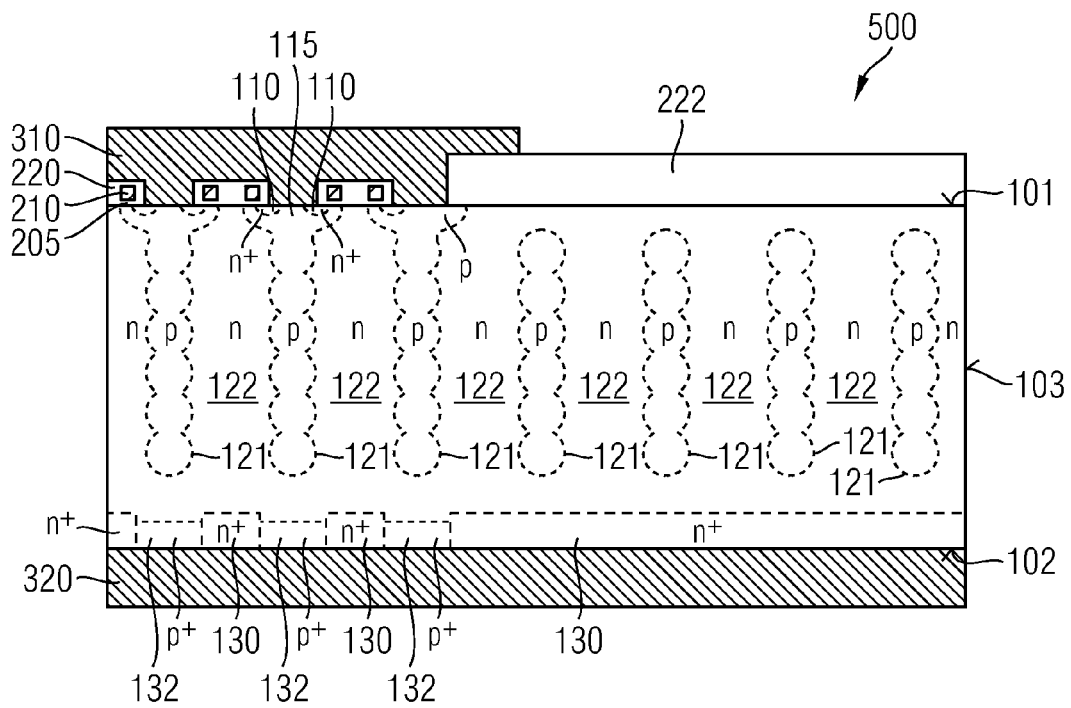
FIG. 4D is a schematic cross-sectional view of a portion of a super junction semiconductor device obtained from the semiconductor portion of FIG. 4C.

FIG. 4D shows a semiconductor device 500 resulting from the semiconductor portion of FIG. 4C after providing gate dielectric 205, gate electrodes 210, dielectric layers 220, 222 and first and second electrode structures 310, 320. The counter-doped islands 132 are absent in the edge region 690.

Figure 5:
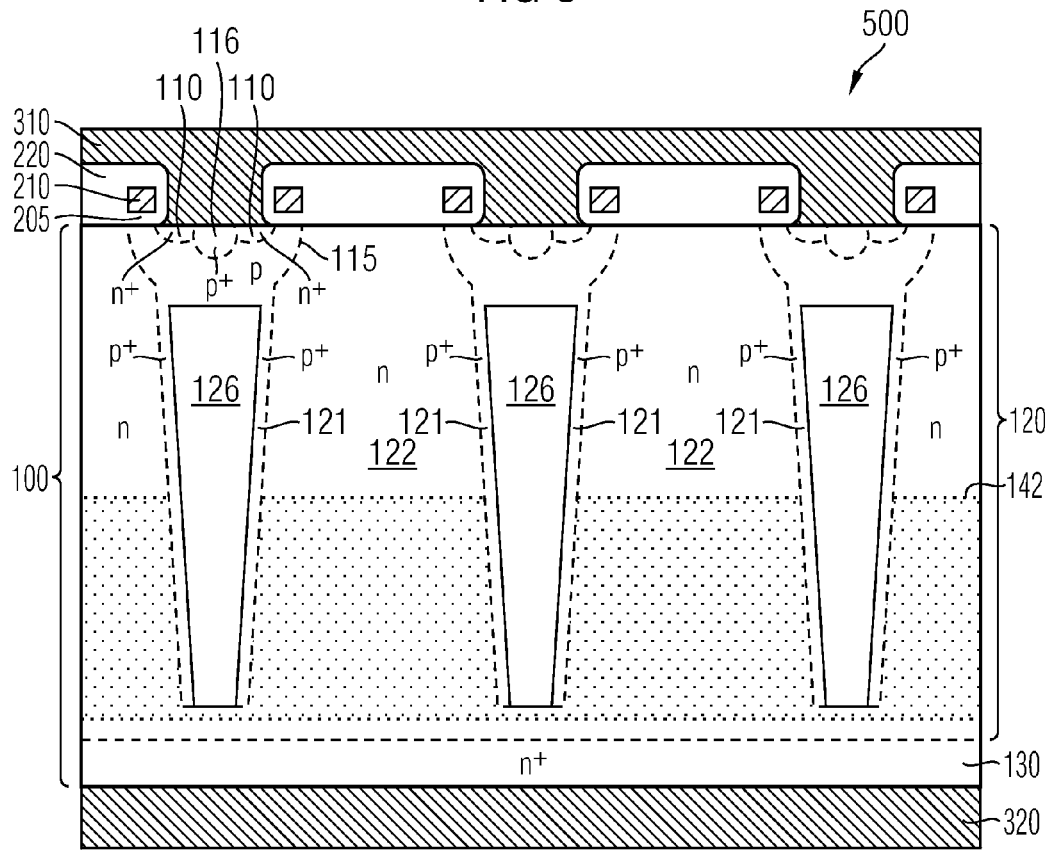
FIG. 5 is a schematic cross-sectional view of a portion of a super junction semiconductor device in accordance with an embodiment providing a stress relief portion.

FIG. 5 shows a semiconductor device 500 with an auxiliary structure 126 of one or more foreign materials other than a first semiconductor material forming the single-crystal of the semiconductor portion 100. The foreign materials may be dielectric materials like silicon oxide, for example a silicon oxide deposited using TEOS (tetraethylorthosilane) as precursor material, silicon nitride, silicon oxynitride, BSG (boron-silicate-glass), PSG (phosphorus-silicate-glass), BPSG (boron-phosphorus-silicate-glass) or a dielectric polymer.

The auxiliary structure 126 may be a structure embedding a buried gate electrode provided between the first surface 101 and the doped layer 130. According to other embodiments, the auxiliary structure 126 is a by-product resulting from providing the super junction structure by a trench process. Trench processes include introducing trenches into the substrate portion 100 and introducing impurities through sidewalls of the trenches into adjoining sections of the semiconductor portion 100, e.g., by an angled implant, or depositing one or more heavily doped layers, to form the first and/or second super junction regions 121, 122. After the implant or the deposition of the one or more heavily doped layers, the trenches may be filled with a solid foreign material to form the auxiliary structures 126.

The auxiliary structures 126 may be formed within a section of the semiconductor portion 100 between the first surface 101 and a buried edge of the super junction structure oriented to the second surface 102. The semiconductor portion 100 may include a stress relief portion 142, with atoms of a second semiconductor material replacing atoms of the first semiconductor material in the crystal lattice of the single-crystal forming the semiconductor portion 100. For example, the first semiconductor material is silicon Si and the second semiconductor material is germanium Ge. The stress relief portion 142 may be formed by implanting Ge through the second surface 102 after thinning and before providing the second electrode structure 320.

In the stress relief portion 142, the atoms of the second semiconductor material change the lattice parameter of the single-crystal. The concentration of the second semiconductor material may be tuned to compensate for a wafer bowing induced by mechanical stress resulting from different thermal expansion coefficients of the semiconductor material and the foreign material, wherein the wafer is a composite of a plurality of identical substrate portions. With thin wafers and substrate portions 100 below 175 μm, wafer bowing complicates wafer handling and may even result in cracks damaging the wafers.

The stress relief portion 142 may overlap at least a part of the drift zone 120, for example the half of the drift zone 120 oriented to the second surface 102. The stress relief portion 142 overlaps both first and second super junction regions 121, 122. According to other embodiments, the stress relief portion 142 overlaps the complete drift zone 120. In addition, the stress relief portion 142 may overlap other doped structures, e.g., the doped layer 130.

Figure 6A:
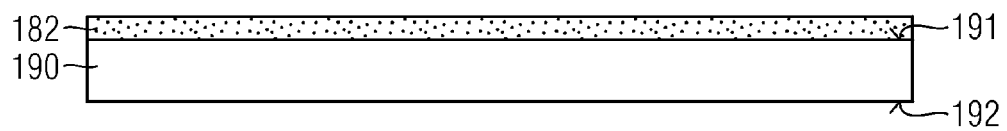
FIG. 6A is a schematic cross-sectional view of a base substrate for illustrating a method of manufacturing a semiconductor device using a porous layer.
Figure 6B:
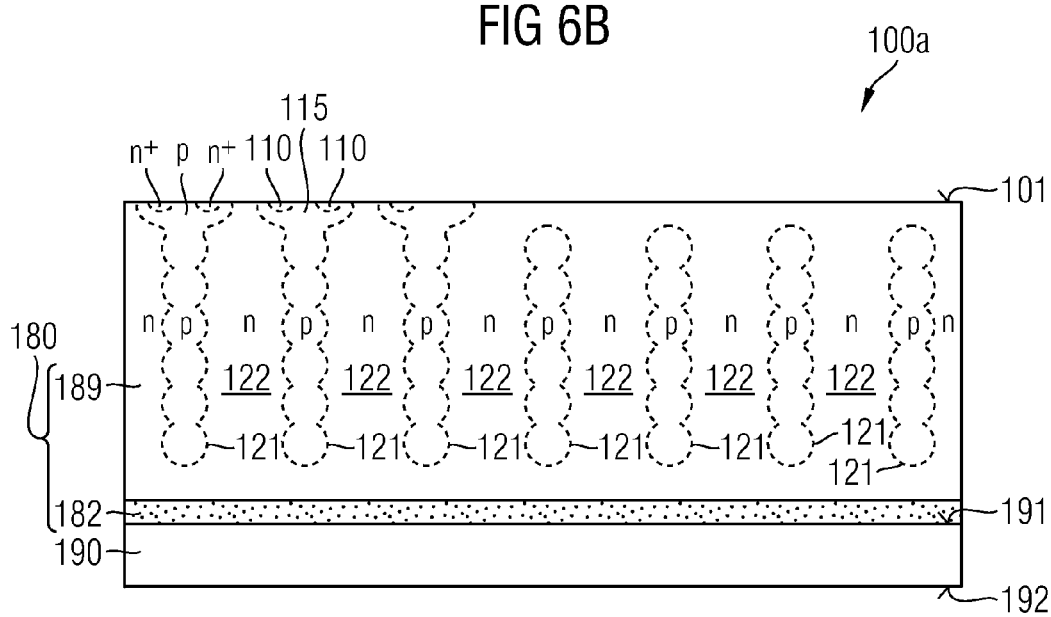
FIG. 6B is a schematic cross-sectional view of a semiconductor substrate obtained from the base substrate of FIG. 6A by epitaxy.
Figure 6C:
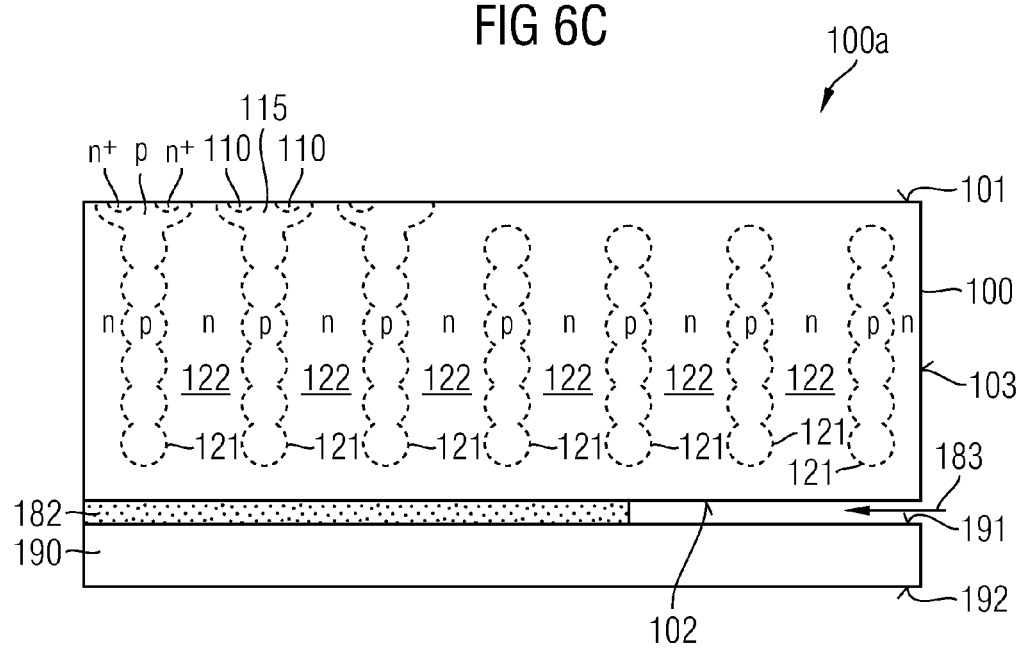
FIG. 6C is a schematic cross-sectional view of the portion of the semiconductor substrate of FIG. 6B during thinning using the porous layer.

FIGS. 6A to 6C refer to an embodiment using a porous layer 182 for the thinning of a semiconductor substrate 100a to obtain thinned semiconductor portions 100.

According to FIG. 6A, a base substrate 190 with two parallel process surfaces 191, 192 is provided, and includes a single crystalline semiconductor material as described for FIG. 2A. A porous layer 182 may be provided on the first process surface 191. According to another embodiment, the porous layer 182 may be formed in a section of the base substrate 190 directly adjoining the first process surface 191. The porous layer 182 is a single crystalline semiconductor layer, which crystal lattice is in register with the crystal lattice of the base substrate 190 but with nano-scale swaths and voids having dimensions greater than the lattice constant.

For example, the porous layer 182 may include nano-pores having a pore diameter below about 2 nm and/or meso-pores having diameters between about 2 nm and about 100 nm and/or macro-pores having diameters in the micrometer range. The porosity may be greater than 30%, for example greater than 50%. The porous layer 182 may be formed by an anodic oxidation using one or more solution(s) containing fluoride F. According to an embodiment, a semiconductor layer is grown by epitaxy and an anodic oxidation process is performed using a solution containing hydrofluoric acid HF and ethanol or acetic acid. Other embodiments employ HF/dimethylformamide or HF/acenitrile, optionally in combination with a light source.

FIG. 6A shows the porous layer 182 provided on the first process surface 191 of the base substrate 190, which may include an intrinsic semiconductor material. The thickness of the porous layer 182 may be between 1 μm and 50 μm. Further portions 189 of a semiconductor layer 180 may be grown by epitaxy on the porous layer 191, for example an epitaxy process using trichlorosilane.

First and second super junction regions 121, 122 are formed in a drift layer 120 of the semiconductor layer 180 by repeating a sequence that includes growing a sub-layer per epitaxy and implanting impurities of at least one conductivity type into a surface of the sub-layer using an implant mask, wherein the super junction structure is obtained by diffusing at least one of the first and second super junction regions 121, 122 out from the implants.

During formation of the super junction structure in the drift layer 120, oxygen atoms/ions diffusing out of the base substrate 190 in the direction of the drift layer 120 are gettered along the inner walls of the pores in the porous layer 182. Thereby the porous layer 182 keeps low the concentration of thermal donator impurities in the drift layer 120, which could otherwise adversely affect the device characteristics, e.g., the electric strength in the reverse direction.

FIG. 6B shows a semiconductor substrate 100a obtained from the base substrate 190 and the semiconductor layer 180 with the porous layer 182 and the super junction structure including the first and second super junction regions 121, 122. Thinning of the semiconductor substrate 100a includes parting the semiconductor substrate 100a along the porous layer 182. For example a fluid beam 183 containing a gaseous fluid or a liquid, e.g., water, may be directed to a portion of an outer surface 103 of the semiconductor substrate 100a where the porous layer 182 is exposed.

The fluid mechanically breaks (crunches, dissolves, disperses) the porous layer leaving the base substrate 190 separated from the remaining portions of the semiconductor layer 180. According to another embodiment, hydrogen is introduced into the porous layer 182. The hydrogen reallocates the pores in a way that cavities are formed along the interfaces to the base substrate 190 and the further portions 189 of the semiconductor layer 180. The cavities grow such that the base substrate 190 is separated from the further portions 189.

FIG. 6C shows the fluid beam 183 impinging on an exposed section of the porous layer 182 and dispersing the semiconductor material of the porous layer 182. According to an embodiment, the thinning may be finished with the parting and a subsequent cleaning process. According to other embodiments the thinning may include CMP, wet etching, or combinations of both which may further thin the substrate portion 100 and/or planarize the second surface 102.

Figure 6D:
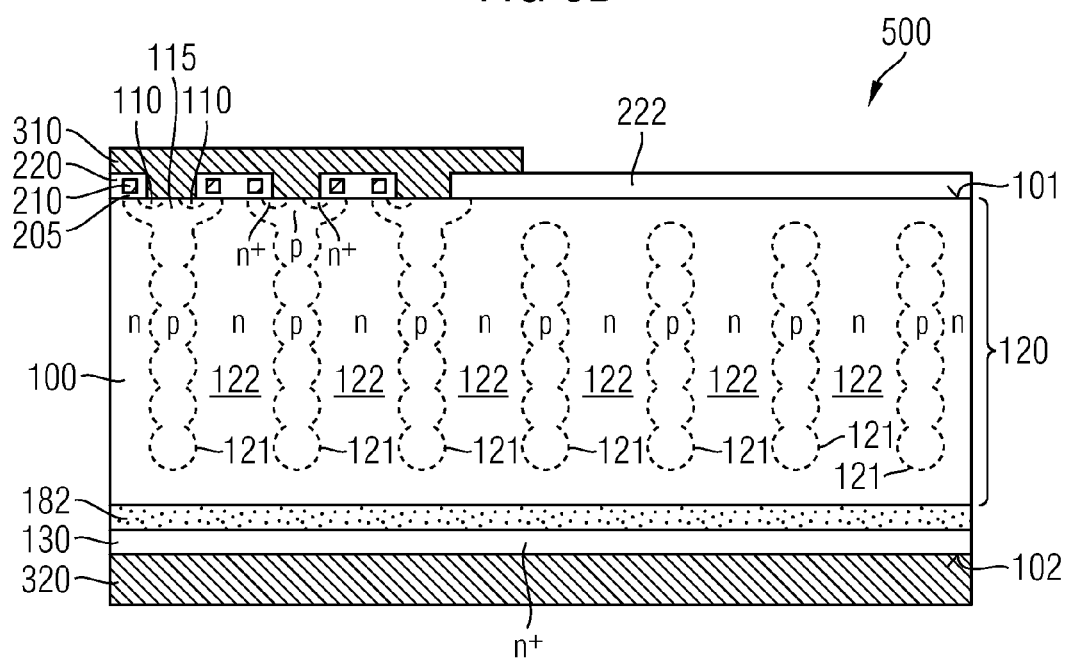
FIG. 6D is a schematic cross-sectional view of a portion of a super junction semiconductor device in accordance with an embodiment providing a porous layer.

A porous layer 182 provided between the super junction structure with the first and second super junction regions 121, 122 and the second surface 102 distinguishes the embodiment of FIG. 6D from that in FIG. 2D. The porous layer 182 includes nano-pores. The porosity is at most 5%. The nano-pores getter oxygen atoms/ions diffusing into the direction of the drift layer 120 along inner surfaces of the nano-pores in the crystal lattice. As a consequence, the porous layer 182 keeps low the concentration of thermal donator impurities in the drift layer 120, which otherwise may adversely affect the device characteristics.

Figure 7A:
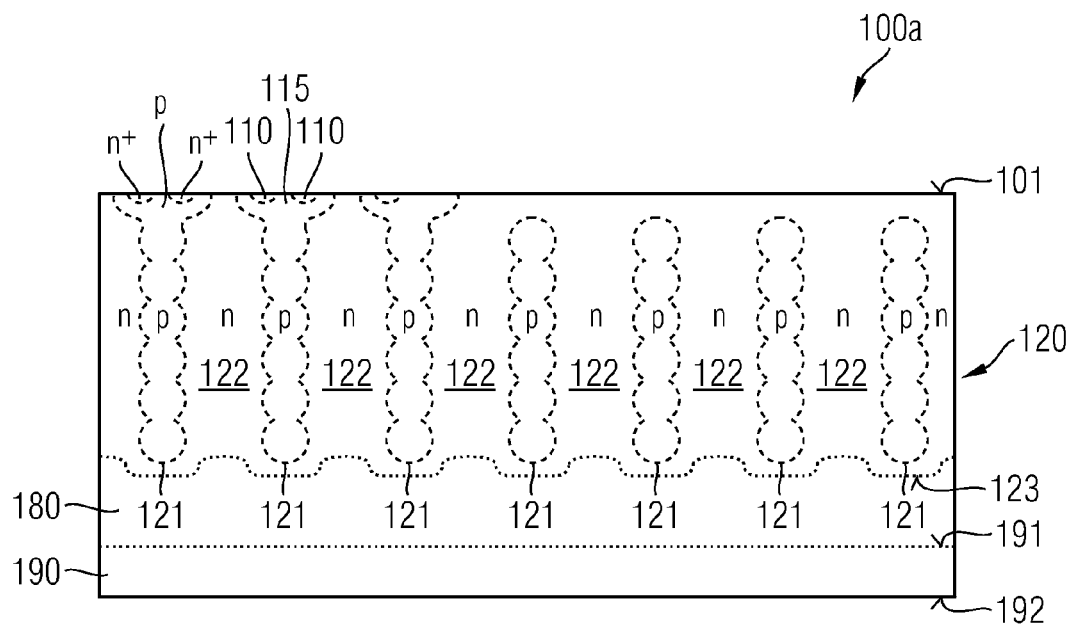
FIG. 7A is a schematic cross-sectional view of a portion of a semiconductor substrate for illustrating a method of manufacturing a super junction semiconductor device using a self-aligned thinning process.
Figure 7B:
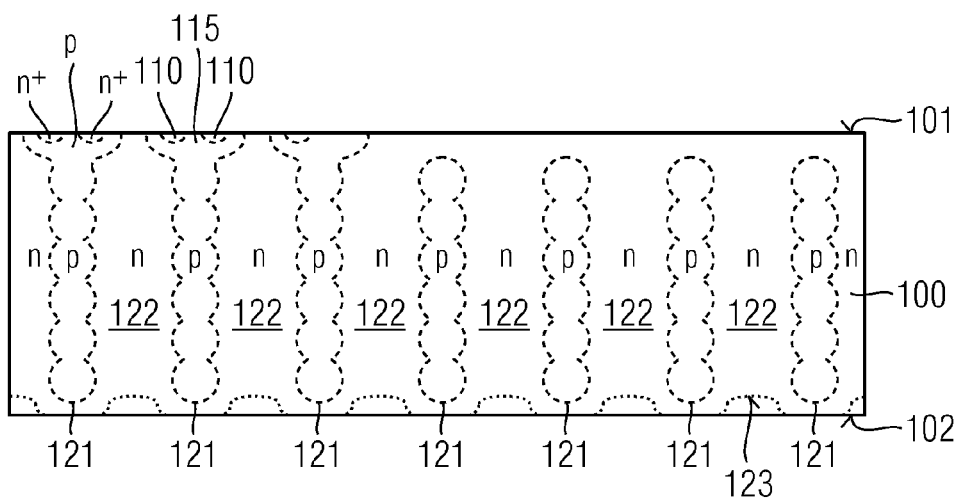
FIG. 7B is a schematic cross-sectional view of a semiconductor substrate obtained from the semiconductor substrate of FIG. 7A by thinning.
Figure 7C:
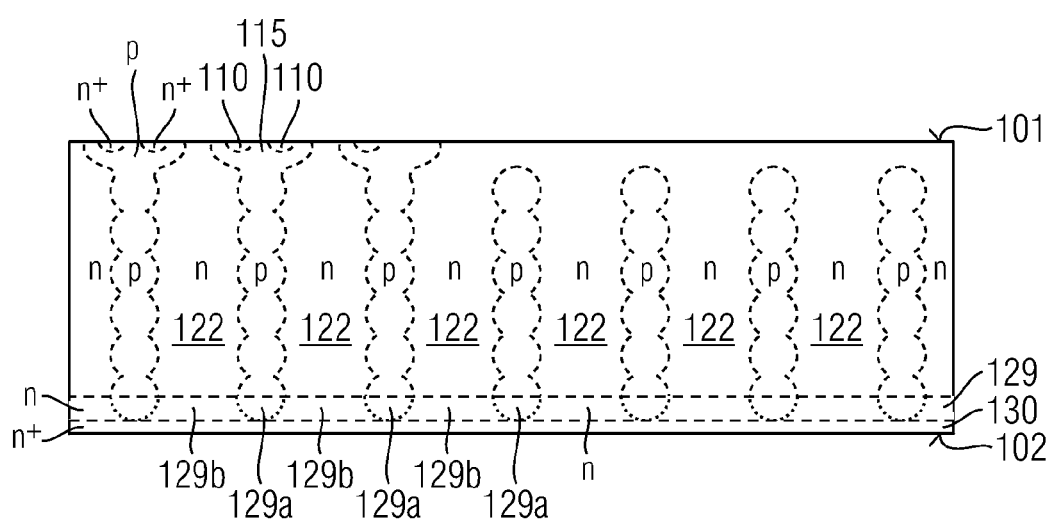
FIG. 7C is a schematic cross-sectional view of the semiconductor substrate of FIG. 7B after implanting a field stop structure.

FIGS. 7A to 7C refer to a self-aligned thinning process. A semiconductor layer 180 is provided on a first process surface 191 of a base substrate 190 with a second process surface 192 parallel to the first process surface 191. A super junction structure including first and second super junction regions 121, 122 is formed in a drift layer 120 of the semiconductor layer 180. For the manufacture of IGFETs and IGBTs base zones 115 and doped zones (source zones) 110 are formed along an exposed first surface 101 of the semiconductor layer 180 parallel to the first process surface 191. Depletion zones 123 extend along the pn-junctions in the drift layer 120.

FIG. 7A shows that at least portions of a depletion zone boundary 123 are located between the super junction structure and the second process surface 192. A wet etch process effective on the second process surface 192 is performed that stops in a self-aligned manner when it reaches the depletion zone boundary 123. For example, an etch stop signal may be generated when the depletion zone boundary 123 is exposed and the wet etch is stopped in response to the etch stop signal. According to another embodiment, the wet etch process is charge selective and stops at the depletion zone boundary 123 assigned to the super junction structure.

As shown in FIG. 7B, a semiconductor portion 100 with two parallel surfaces 101, 102 is obtained from the semiconductor layer 180 of FIG. 7A. A first surface 101 of the semiconductor portion 100 is the exposed surface of the semiconductor layer 180. A second surface 102 is obtained by thinning the composite formed by the base substrate 190 and semiconductor layer 180 from the second process surface 192. The self-aligned process allows for tuning precisely the thickness of the substrate portion 101.

Impurities of the first conductivity type may be implanted through the thinned second surface 102 to form a field stop structure 129. The implant may be effective for the whole second surface 102, for the whole cell area, or for portions of the cell area. The implant dose for surface sections in the vertical direction of the first super junction regions 121 may be the same as or may be higher than for surface sections in the vertical direction of the second super junction regions 122. A doped layer 130 may be formed by an implant, e.g., an amorphizing implant as described above.

FIG. 7C shows an embodiment with first sections 129a of the field stop structure 129 in the vertical projection of the first super junction regions 121 formed by a higher implant dose than second sections 129b in the vertical projection of the second super junction regions 122 such that the higher implant dose counter-dopes sections of the original first super junction regions oriented to the second surface 102. The net dopant concentrations in the first and second sections 129a, 129b may be almost equal. Other embodiments provide the field stop implant exclusively into the first super junction regions 121. The counter-doping of sections of the first super junction regions 121 allow implementation of field stop structures 129 even when after a self-aligned wet etch process a distance between the first super junction regions 121 and the second surface 102 is too narrow for implementing a field stop layer 129 in a conventional manner.

Figure 8A:
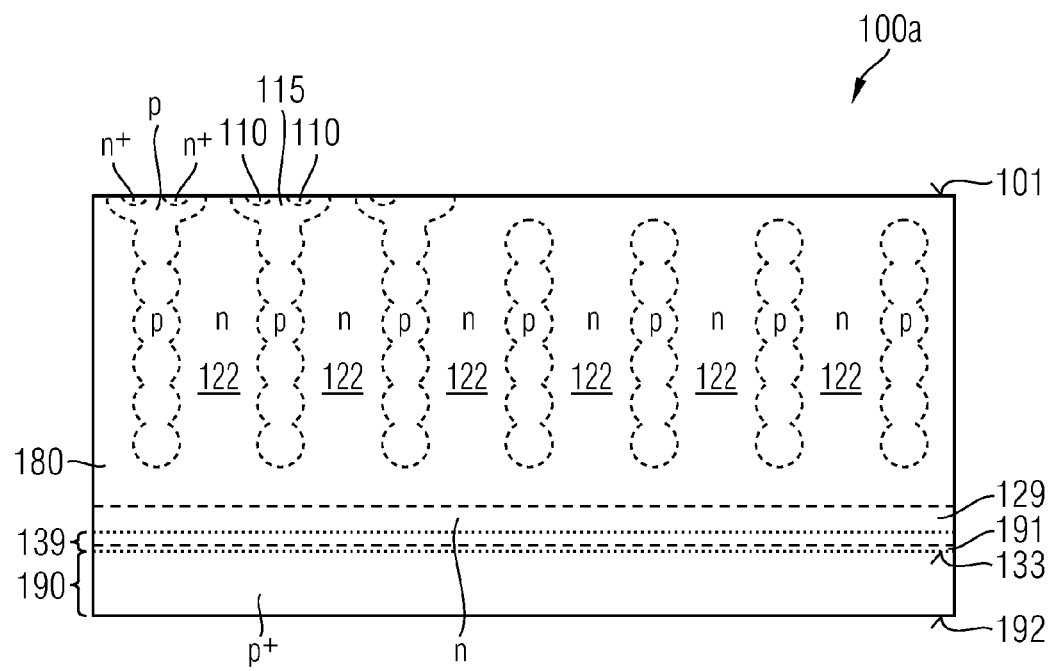
FIG. 8A is a schematic cross-sectional view of a semiconductor substrate for illustrating a method of manufacturing a super junction semiconductor device using a layer of a first conductivity type for self-aligned thinning.
Figure 8B:
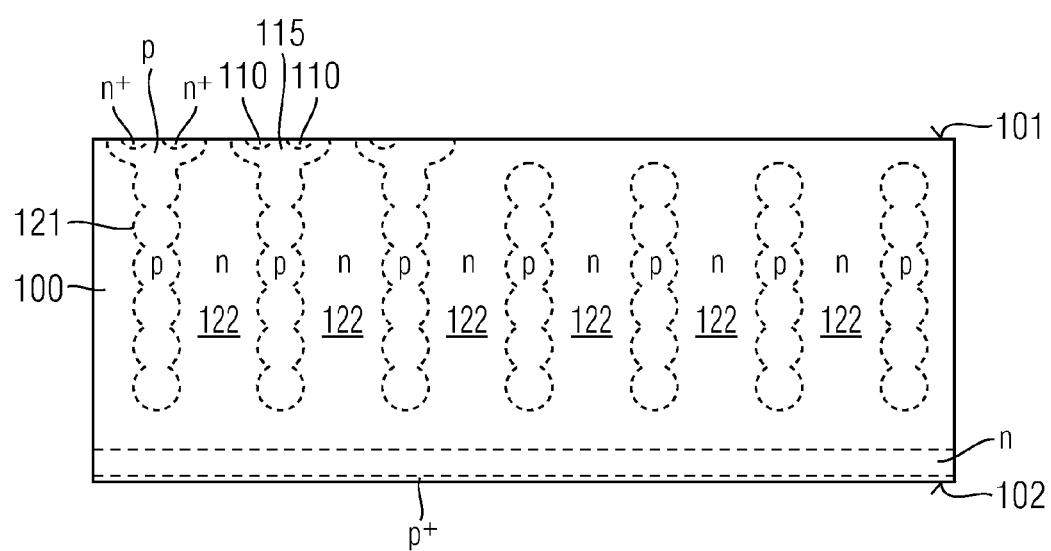
FIG. 8B is a schematic cross-sectional view of a semiconductor portion obtained from the semiconductor substrate of FIG. 8A by thinning.

FIGS. 8A to 8B refer to a self-aligned thinning process using a pn-junction in the base of the semiconductor portion 100. For example, a semiconductor layer 180 as described for FIG. 6B is formed on a first process surface 191 of a base substrate 190, which may be of the second conductivity type. The semiconductor layer 180 may include a sub-layer of the first conductivity type, e.g., a layered field stop structure 129. According to other embodiments, the layered field stop structure is obtained by implanting suitable impurities, e.g., hydrogen (protons), either through the base substrate 190 or through an exposed first surface 101 of the semiconductor layer 180, wherein the implant may be tempered at temperatures between 380 and 420 degree Celsius.

FIG. 8A shows a depletion zone 139 that extends on both sides of a pn-junction formed between the layered field stop structure 129 and the base substrate 190. A planar depletion zone boundary 133 is formed within the base substrate 190. A wet etch thins the base substrate 190 from a second process surface 192 of the base substrate 190, which is parallel to the first process surface 191. The etch may stop at the planar depletion zone boundary 133.

FIG. 8B illustrates the semiconductor portion 100 obtained from the composite containing the semiconductor layer 180 and the base substrate 190 of FIG. 8A. The position of the second surface 102 of the semiconductor portion 100 is defined by the planar depletion zone boundary 133 in FIG. 8A.

According to an embodiment, the impurity concentration in the base substrate 190 is at least 100 times the impurity concentration in the field stop structure 129, such that the depletion zone extends only to a very low degree into the base substrate 190 and the planar depletion zone boundary 133 approximately coincides with the interface between the base substrate 190 and the semiconductor layer 180. Other embodiments may provide a defined overetch of the planar depletion zone boundary 133 to remove remnant portions of the base substrate 190 and a defined portion of the semiconductor layer 180.

Providing the first and second super junction regions 121, 122 by repeating a sequence including growing a sub-layer by epitaxy and implanting impurities of at least one conductivity type into a surface of the sub-layer using an implant mask, and obtaining the super junction structure by diffusing at least one of the first and second super junction regions 121, 122 from the implants may result in undulated impurity profiles of the first and second super junction regions 121, 122, wherein the undulation may occur in the vertical, and/or lateral direction.

FIGS. 9A to 9G refer to super junction structures obtained by trench approaches that provide non-undulated impurity profiles. The trench approaches provide introducing trenches into a semiconductor substrate from a direction opposite to the direction from which the thinning is performed.

For example, the super junction semiconductor device 500 of FIG. 9A may be obtained by etching trenches into an n-type semiconductor substrate, lining at least sidewalls of the etched trenches with a dielectric liner 125 and then growing by epitaxy single-crystalline p-doped semiconductor material in the trenches to form the first super junction regions 121. The first super junction regions 121 may be homogenously doped. Each first super junction region 121 may directly adjoin a portion of a segmented field stop structure 129 formed in its vertical projection. The field stop structure 129 may include portions directly adjoining the doped layer 130 in the projection of the first super junction regions 121. The field stop structure 129 may be completely absent in the projection of the second super junction regions 122. According to an embodiment, segments of the field stop structure 129 may be implanted through the trench bottoms.

FIG. 9B shows a super junction semiconductor device 500 with a first portion 121a of the first super junction regions 121 oriented to the first surface 101 having a higher impurity concentration than a second portion 121b oriented to the second surface 102. Other embodiments may provide first super junction regions 121 with more than two portions of different impurity concentrations or with smoothly varying impurity profiles.

FIG. 9C shows a super junction device 500 including a dielectric liner 125 that lines trenches introduced into a semiconductor portion 100 from a direction given by the first surface 101 and that includes a sidewall portion 125a covering a sidewall of the trench and a bottom portion 125b extending at the bottom of the trench in substance parallel to the second surface 102 and closing the trench at the bottom. As a result, the dielectric liner 125 encloses the first super junction regions 121 in the drift layer 120 completely. Between the first super junction regions 121 and the first surface 101, body zones 115 or doped zones 110 may be formed that directly adjoin the first super junction regions 121.

The field stop structure 129 may be segmented with each segment located in the vertical projection of one of the second super junction regions 122. The field stop structure 129 may be absent in the projection of the first super junction regions 121.

The super junction semiconductor device 500 of FIG. 9D provides a segmented field stop structure 129 with each segment arranged in the projection of one of the first and second super junction regions 121, 122. The first super junction regions 121 directly adjoin the adjacent second super junction regions 122 and include a higher doped first portion 121a oriented to the first surface 101 and a lower doped second portion 121b oriented to the second surface 102. The super junction structure may be provided by growing a p-doped semiconductor material in a trench introduced from a direction given by the first surface 101.

FIG. 9E shows a continuous field stop structure 129 having an interface to the drift layer 120 which in substance is parallel to the second surface 102. A heavily n-doped layer 122a of a semiconductor material is provided, for example by growing by epitaxy silicon on a trench sidewall or by implanting impurities into the trench sidewall. The trench extends between the body zone 115 and the field stop structure 129 and may extend into the field stop structure 129. The heavily n-doped layer 122a forms part of the second super junction regions 122. Growing by epitaxy a single crystalline p-type semiconductor material within the trenches may form the first super junction regions 121.

The super junction semiconductor device 500 of FIG. 9F differs from that in FIG. 9E in that the first super junction regions 121 are formed as a heavily doped layer lining the trench and directly adjoining a heavily doped n-doped layer 122a. The heavily doped layer forming the first super junction regions 121 may be formed by an angled implant into the sidewalls and the bottom of the trenches after implanting the heavily doped portions 122a of the second super junction regions 122. Then a further epitaxial layer may be grown that closes the trenches to form voids 123. In the epitaxial layer grown above the voids 123, doped zones 110 and body zones 115 may be formed.

Figure 9G:
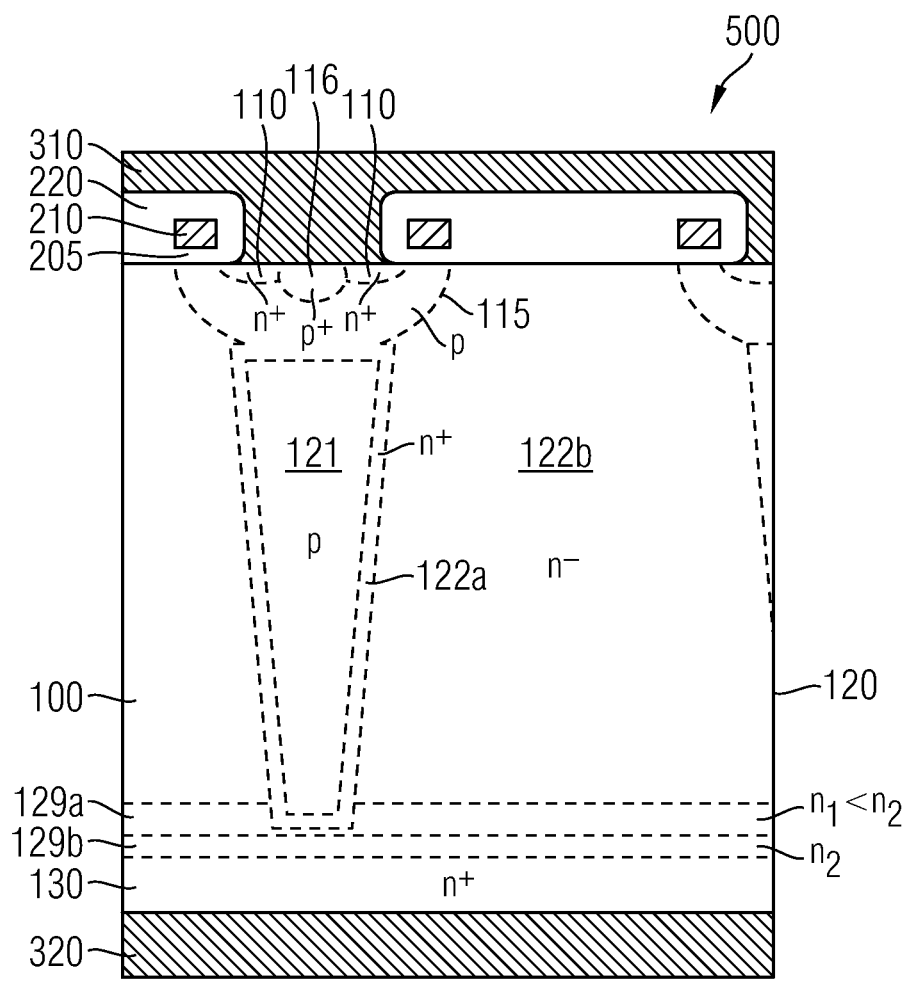
FIG. 9G is a schematic cross-sectional view of a portion of a super junction semiconductor device in accordance with an embodiment providing a multi-step field stop structure.

The super junction device 500 shown in FIG. 9G includes the super junction structure of FIG. 9E. The field stop structure 129 includes a lower doped first portion 129a directly adjoining the drift layer 120 and a stronger doped second portion 129b directly adjoining the doped layer 130, wherein an interface between the first and the second portions 129a, 129b is in substance parallel to the second surface 102.

Figure 10:
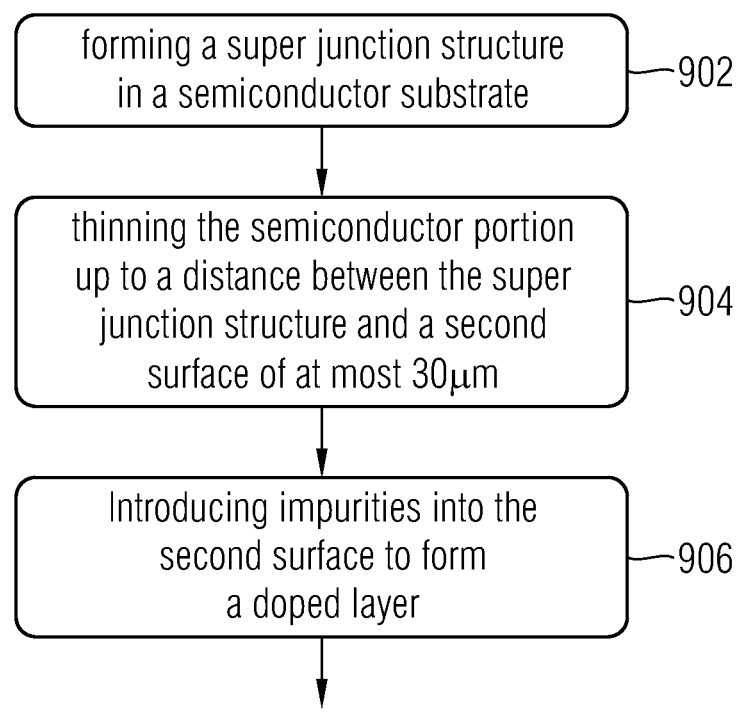
FIG. 10 is a simplified flow chart of a method of manufacturing a super junction semiconductor device according to an embodiment.

The method of manufacturing a super junction semiconductor device as illustrated in FIG. 10 includes forming columnar first and second super junction regions of opposite conductivity types in a semiconductor substrate (902). The first and second super junction regions extend in a direction perpendicular to a process surface of the semiconductor substrate and form a super junction structure. The semiconductor substrate is thinned starting from the process surface to obtain a single crystalline semiconductor portion with a first surface and a second surface (904). The second surface is obtained from the process surface and is parallel to the first surface. A distance between the first super junction regions having the second conductivity type and the second surface does not exceed 30 µm. Into the second surface, impurities of the first conductivity type are introduced to form a doped layer between the super junction structure and the second surface at least in a cell area (906).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A super junction semiconductor device, comprising:
    a semiconductor portion with a first surface and a second surface parallel to the first surface, and comprising a doped layer of a first conductivity type formed at least in a cell area; and
    columnar first super junction regions of a second, opposite conductivity type extending in a direction perpendicular to the first surface and separated by columnar second super junction regions of the first conductivity type, the first and second super junction regions forming a super junction structure between the first surface and the doped layer, wherein a distance between the first super junction regions and the second surface does not exceed 30 µm.

2. The super junction semiconductor device of claim 1, wherein a thickness of the semiconductor portion between the first and second surfaces is at most 100 µm.

3. The super junction semiconductor device of claim 1, further comprising a first electrode structure directly adjoining the first surface and a second electrode structure directly adjoining the second surface, the first electrode structure having a first thickness and the second electrode structure having a second thickness, wherein the sum of the first and second thicknesses is at least 20% of the thickness of the semiconductor portion between the first and second surfaces.

4. The super junction semiconductor device of claim 1, further comprising counter-doped islands of the second conductivity type, the counter-doped islands directly adjoining the second surface and being separated by portions of the doped layer.

5. The super junction semiconductor device of claim 4, wherein the counter-doped islands are aligned to the first super junction regions and are absent in an edge area surrounding the cell area.

6. The super junction semiconductor device of claim 1, further comprising:
    auxiliary structures formed within a section between the first surface and a buried edge of the super junction structure oriented to the second surface, the auxiliary structures provided from a foreign material different from a first single-crystalline semiconductor material forming the semiconductor portion; and
    a stress relief portion with atoms of a second semiconductor material replacing atoms of the first semiconductor material in a crystal lattice of the single-crystal forming the semiconductor portion.

7. The super junction semiconductor device of claim 6, wherein the stress relief portion overlaps portions of the first and/or second super junction regions.

8. The super junction semiconductor device of claim 1, further comprising a porous layer between the super junction structure and the doped layer.

9. The super junction semiconductor device of claim 8, wherein the porous layer is formed directly adjacent to the doped layer.

10. The super junction semiconductor device of claim 1, wherein the doped layer directly adjoins the second surface and is formed by solid phase epitaxy.

11. The super junction semiconductor device of claim 1, further comprising a field stop structure that is of the first conductivity type, directly adjoins the doped layer and has a mean impurity concentration that is at most 10% of the maximum impurity concentration in the doped layer.

12. The super junction semiconductor device of claim 1, wherein the field stop structure includes counter-doped sections in a vertical projection of the first super junction regions.

13. The super junction semiconductor device of claim 1, wherein the super junction semiconductor device is an insulated gate field effect transistor and the doped layer corresponds to a drain layer and directly adjoins the second surface.

14. A super junction semiconductor device, comprising:
    a semiconductor portion with a first surface and a second surface parallel to the first surface, and comprising a doped layer of a first conductivity type formed at least in a cell area;
    columnar first super junction regions of a second, opposite conductivity type extending in a direction perpendicular to the first surface and separated by columnar second super junction regions of the first conductivity type, the first and second super junction regions forming a super junction structure between the first surface and the doped layer, wherein a distance between the first super junction regions and the second surface does not exceed 30 µm; and
    counter-doped islands of the second conductivity type, the counter-doped islands directly adjoining the second surface and being separated by portions of the doped layer.

* * * * *